US009183949B2

United States Patent
Noda et al.

(10) Patent No.: US 9,183,949 B2
(45) Date of Patent: Nov. 10, 2015

(54) SEMICONDUCTOR DEVICE

(75) Inventors: Hiromasa Noda, Tokyo (JP); Toshio Ninomiya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 1001 days.

(21) Appl. No.: 13/324,567

(22) Filed: Dec. 13, 2011

(65) Prior Publication Data

US 2012/0158347 A1 Jun. 21, 2012

(30) Foreign Application Priority Data

Dec. 16, 2010 (JP) .................................. 2010-280571

(51) Int. Cl.
*G11C 29/02* (2006.01)

(52) U.S. Cl.
CPC ............ *G11C 29/028* (2013.01); *G11C 29/021* (2013.01); *G11C 29/023* (2013.01)

(58) Field of Classification Search
CPC .. G11C 29/028; G11C 29/023; G11C 29/021; G11C 29/024; G11C 29/46; G01R 31/3185; G01R 31/318572; G01R 31/318594; G01R 31/318536

See application file for complete search history.

(56) References Cited

U.S. PATENT DOCUMENTS

| 6,079,039 A * | 6/2000 | Nakamura | 714/726 |
|---|---|---|---|
| 6,289,469 B1 | 9/2001 | Sakata et al. | |
| 6,353,565 B2 | 3/2002 | Ito | |
| 6,928,596 B2 | 8/2005 | Kimura et al. | |
| 7,870,452 B2 | 1/2011 | Souef et al. | |

FOREIGN PATENT DOCUMENTS

| JP | 62-209926 A | 9/1987 |
|---|---|---|
| JP | 2-205111 A | 8/1990 |
| JP | 10-170609 A | 6/1998 |
| JP | 11-085562 A | 3/1999 |
| JP | 2001-243796 A | 9/2001 |
| JP | 2002-093197 A | 3/2002 |
| JP | 2005-191684 A | 7/2005 |
| JP | 2009-508101 A | 2/2009 |
| WO | WO 2007/029190 A2 | 3/2007 |

* cited by examiner

*Primary Examiner* — Manuel L Barbee

(57) ABSTRACT

A device includes a decoder, a selector, and a plurality of registers. The decoder is configured to generate a plurality of test signals. The selector is coupled to the decoder. The selector is configured to sequentially select a test signal from the plurality of test signals and to sequentially output the test signal selected. The plurality of registers is coupled in series to each other. The plurality of registers includes a first stage register. The first stage register is coupled to the selector to sequentially receive the test signal from the selector.

20 Claims, 15 Drawing Sheets

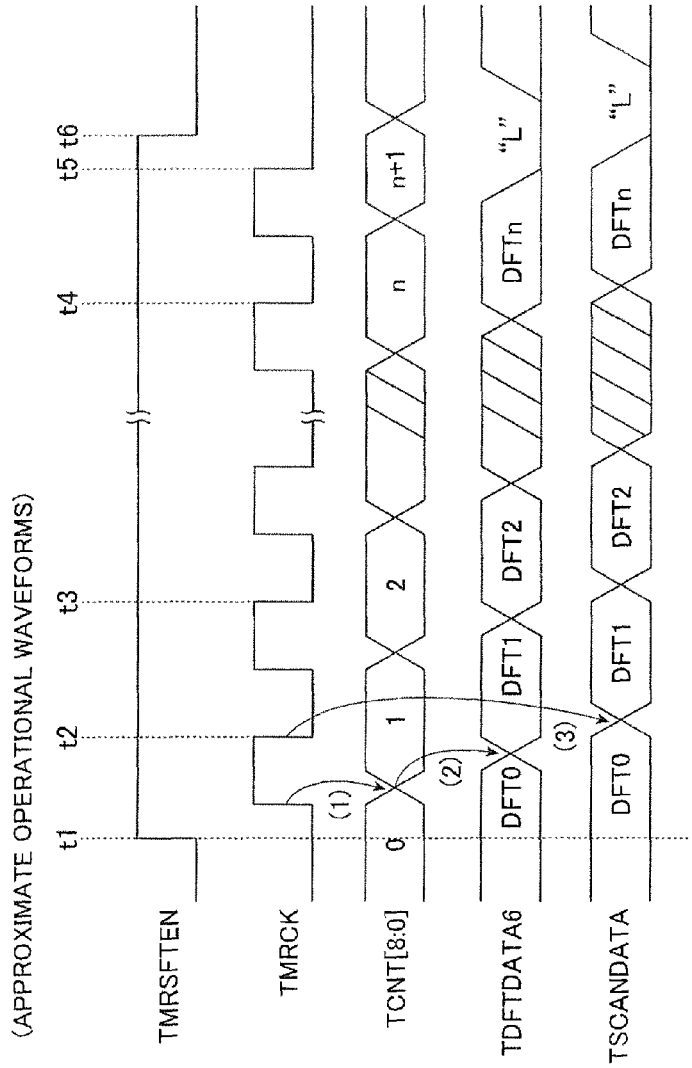

US 9,183,949 B2

SEMICONDUCTOR DEVICE

BACKGROUND OF THE INVENTION

1. Field of the Invention

The present invention generally relates to a semiconductor device. More specifically, the present invention relates to a semiconductor device that has a test circuit that generates a test signal that performs operational adjustment of internal circuitry.

Priority is claimed on Japanese Patent Application No. 2010-280571, filed Dec. 16, 2010, the content of which is incorporated herein by reference.

2. Description of the Related Art

With the shrinking of semiconductor elements, manufacturing variations in process dimensions have come to greatly affect the electrical characteristics of semiconductor elements, and the operational characteristics of a semiconductor device have come to be easily influenced by manufacturing variations. For this reason, there is an increased need to use a test circuit provided within a semiconductor device to generate a test signal so as to perform an operational test of internal circuitry included in the semiconductor device. Given this, in order to have a test circuit generate a test signal to perform a test of the operating margin of internal circuitry, the internal power supply voltage and the internal signal timing are varied so as to cause malfunctioning of the semiconductor device to surface, and to detect the semiconductor device as a malfunctioning product having a small operating margin.

Japanese Patent Application Publication No. JPA 2001-243796 discloses a semiconductor device having a test circuit that generates a plurality of test signals.

SUMMARY

In one embodiment, a device may include, but is not limited to, a decoder, a selector, and a plurality of registers. The decoder is configured to generate a plurality of test signals. The selector is coupled to the decoder. The selector is configured to sequentially select a test signal from the plurality of test signals and to sequentially output the test signal selected. The plurality of registers is coupled in series to each other. The plurality of registers includes a first stage register. The first stage register is coupled to the selector to sequentially receive the test signal from the selector.

In another embodiment, a device may include, but is not limited to, a decoder, a plurality of registers, a plurality of control circuits, a selector, a counter, and a shift clock generating circuit. The decoder is configured to decode a test information and generate a plurality of signals. The plurality of registers is coupled in series to each other. The plurality of registers includes a first register on a first stage of the plurality of registers. The plurality of control circuits is coupled to the plurality of registers, respectively. The selector is coupled to the decoder and to the first stage register. The selector is configured to select a signal from the plurality of signals and supply the signal as a shift data to the first register. The counter is configured to define the number of selecting by the selector. The counter is configured to supply the selector with a selection signal which sequentially changes the signal to be selected by the selector from the plurality of signals. The shift clock generating circuit is configured to generate a shift clock having a same number of clock cycles as the number of the plurality of control circuits. The shift clock generating circuit is configured to supply the shift clock to the counter and the plurality of registers.

BRIEF DESCRIPTION OF THE DRAWINGS

The above features and advantages of the present invention will be more apparent from the following description of certain preferred embodiments taken in conjunction with the accompanying drawings, in which:

FIG. 8 is a timing chart of operations of the -bit counter and the selector of FIG. 7;

DETAILED DESCRIPTION OF THE PREFERRED EMBODIMENTS

Figure 13:
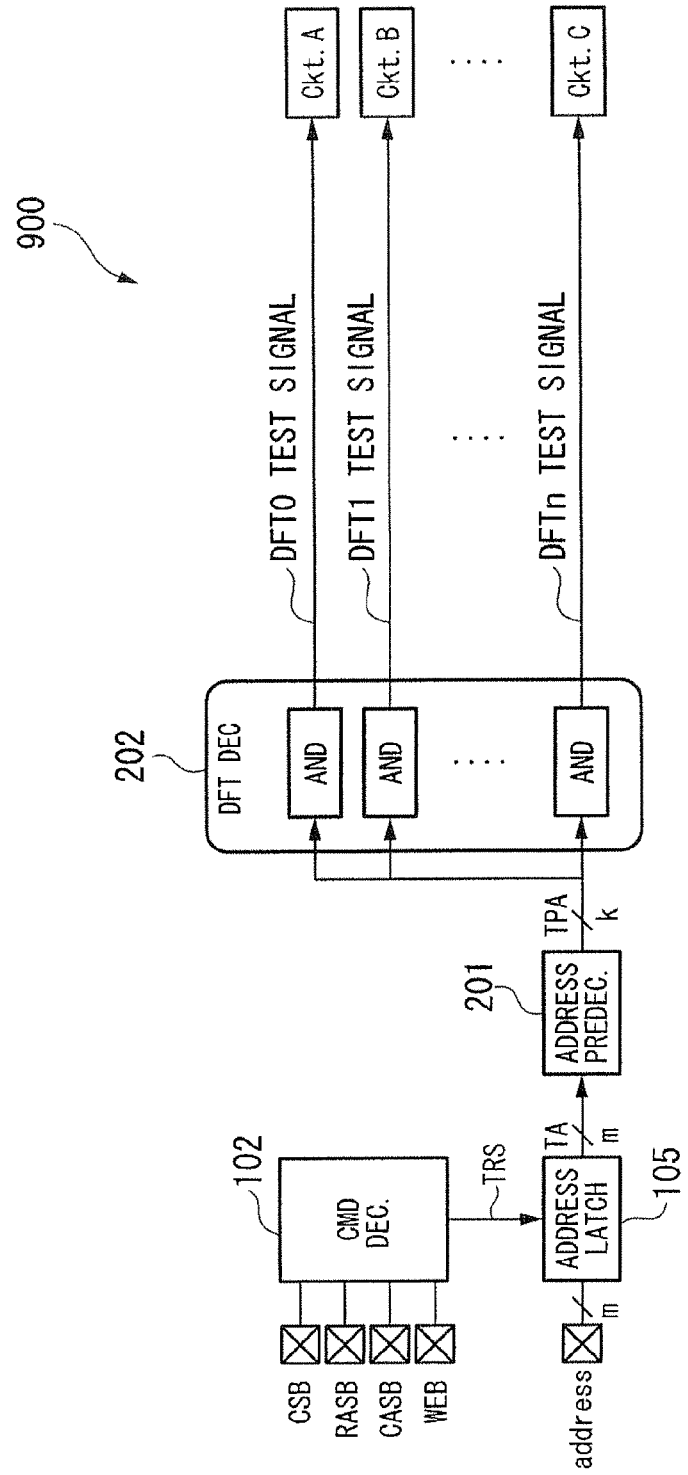
FIG. 13 is a block diagram of a semiconductor device in the related art.
Figure 14:
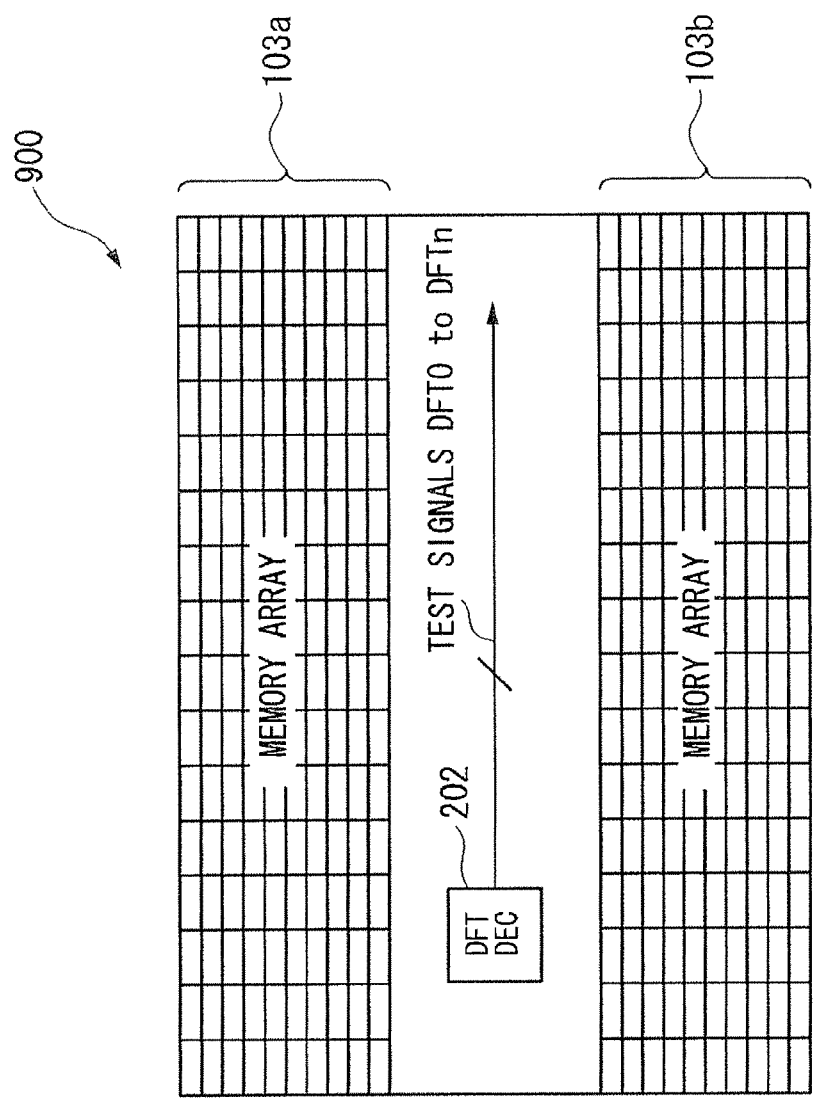
FIG. 14 is a view of a layout of the semiconductor device of FIG. 13.

Before describing the present invention, the related art will be explained in detail with reference to FIGS. 13, 14 and 15, in order to facilitate the understanding of the present invention. FIG. 13 is a circuit block diagram showing the part related to the generation of a test signal in a semiconductor device 900. FIG. 14 is a layout diagram of the semiconductor device 900.

In the semiconductor device 900 shown in FIG. 13, during a test operation, an address latch 105 latches a test code (address signal address) by a test command signal TRS, which is generated by a command decoder 102. The address latch 105 outputs the latched test address signal TA (m bits) to a DFT decoder (designed-for-test decoder) 202, via an address pre-decoder 201.

Then, the DFT decoder 202 decodes the pre-decoded test pre-address signal TPA (k signals) and outputs the desired test signals DFTIN0 to DFTINn. The DFT decoder 202 outputs the test signals DFTIN0 to DFTINn to control circuits (Ckt. A or the like) that perform control of other circuits during testing, via a dedicated interconnect provided for each test signal. In this case, because the required number of test signals DFTIN0 to DFTINn and the control circuits to which they are input is the number of circuits to be controlled, if the number of circuits to be controlled becomes large, the number of interconnects for test signals can become several hundred, for example, such as shown in FIG. 14.

Thus, in a semiconductor device 900 such as this having a test circuit, because the DFT decoders 202 and the control circuits are connected by dedicated interconnects that are provided for each of the test signals DFTIN0 to DFTINn, with an increase in the number of circuits to be controlled in testing, the number of test signals DFTIN0 to DFTINn increases, thereby requiring a large interconnect region. For example, in DDR3-SDRAM, which is a typical semiconductor device, there are several hundred circuits to be controlled in performing testing, and there are several hundred interconnects provided for the test signals DFTIN0 to DFTINn. Additionally, the circuits to be controlled in the testing of the several hundreds of circuits are disposed in various positions distributed in the semiconductor chip. The circuits to be controlled in testing the several hundreds of circuits are disposed in a distributed manner in a memory array that includes a plurality of memory cells, which are storage elements. The circuits to be controlled in testing the several hundreds of circuits are disposed in a distributed manner in the peripheral circuit that controls the memory cell array. For this reason, in a semiconductor chip the region used for interconnect for the test signals (interconnect region) occupies a large part of the chip size. Because of this, in a semiconductor device having a test circuit, with an increase in the number of circuits to be controlled in testing, the number of test signals increases, and as a result the surface area of the interconnect region for the test signals increases, leading to an increase in the chip size.

Figure 15:
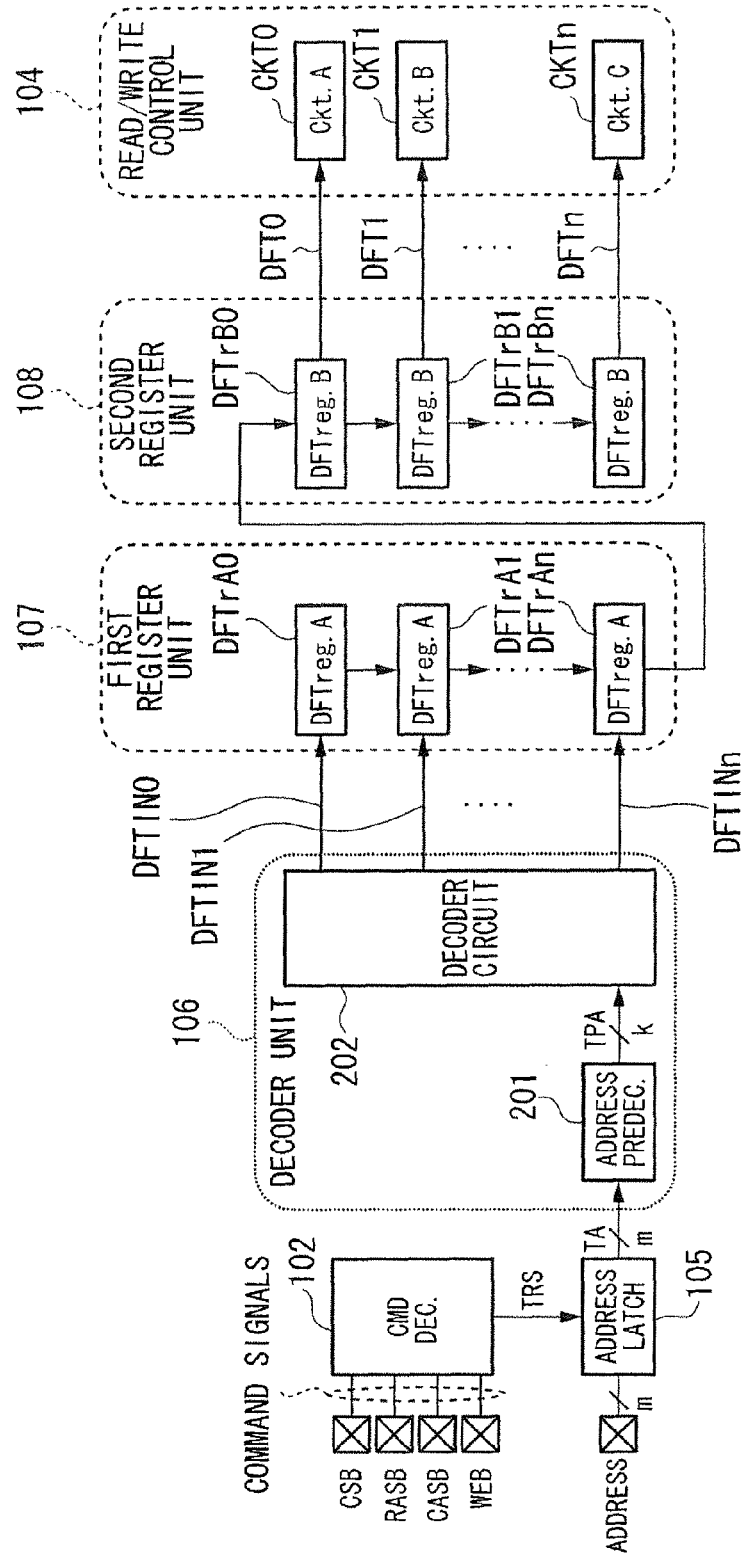
FIG. 15 is a block diagram of a test circuit of the related art.

Because the surface area of the interconnect region increases due to the increase of the number of the test signals, this hinders reduction of the chip size As a countermeasure to the increase in the number of test signals, there is a test circuit shown in FIG. 15, which is prepared by the inventors of the present application. The constitution and the operation of the test circuit shown in FIG. 15 are described below.

In the test circuit shown in FIG. 15, a first register unit 107 is constituted by a plurality of registers DFTrA0 to DFTrAn. A second register unit 108 is constituted by registers DTFrB0 to DTFrBn, the number of which is the same as the numbers of registers in the first register unit 107. Control circuit CKT0 to control circuit CKTn within a read/write control unit 104 are each connected to respective registers DTFrB0 to DTFrBn in the second register unit 108, and to each is input the respective test control signals DFT0 to DFTn. When an active-level test control signal is input thereto, each of the control circuits CKT0 to CKTn performs control in a test of the other circuits within the read/write control unit 104.

Each of the registers DFTrA0 to DFTrAn that are cascade-connected in the first register unit 107 captures the test signals DFTIN0 to DFTINn input from a DFT decoder 202. The plurality of registers DFTrA0 to DFTrAn in the first register unit 107 and the plurality of registers DFTrB0 to DFTrBn in the second register unit 108 constitute a shift register, in which the test signals DFTIN0 to DFTINn captured by each of the DFTrA0 to DFTrAn are sequentially transferred to the next register stage in synchronization with a shift clock (not shown). Ultimately, the plurality of registers DFTrB0 to DFTrBn output the captured signals by transferring as the test control signals DFT0 to DFTn to the control circuits CKT0 to CKTn of the read/write control unit 104.

By virtue of the above-described constitution, the test circuit shown in FIG. 15 can reduce the signals related to the test operation to the one-bit data signal transferred between the first register unit 107 and the second register unit 108, and the signals that controls the first register unit 107 and the second register unit 108. By reducing the signals related to the test operation in this manner, compared with the semiconductor device shown in FIG. 13, it is possible to greatly reduce the amount of surface area of the interconnect region for signals related to the test operation.

However, with the constitution of the test circuit shown in FIG. 15, because twice the number of registers are required as the number of test signals, the scale of the test circuitry for test operation increases, thereby hindering a major reduction in the size of the semiconductor chip.

The shift clock used in the above-noted data transfer is generated within the semiconductor device, using an external clock CK that is supplied to the semiconductor device from outside, and is supplied to the various registers. When testing the semiconductor device, however, there are cases in which the external clock CK is made to have a high frequency for execution of testing. In the case of using a high-frequency external clock CK and executing a test, the data transfer in the test circuit will also become high-speed data transfer, tracking to the external clock CK that has been made high frequency. However, because in order to execute precise operation of the register units high-speed data transfer it is necessary to make the design such that synchronization in the shift clock in each register is maintained, by providing a clock tree within the semiconductor device, so that the delays of the shift clocks supplied to each of the registers are equalized. In implementing such a clock tree, similar to an increase in the number of test signals, accompanying an increase in the size of circuit in the semiconductor device, there is an increase in the size of the semiconductor chip.

Because the monitorability (function enabling verification from the outside of the logic levels of test signals) is poor in a semiconductor device having a test circuit, it is difficult to detect whether or not the test signals are properly transferred to the registers in the test circuit.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a device may include, but is not limited to, a decoder, a selector, and a plurality of registers. The decoder is configured to generate a plurality of test signals. The selector is coupled to the decoder. The selector is configured to sequentially select a test signal from the plurality of test signals and to sequentially output the test signal selected. The plurality of registers is coupled in series to each other. The plurality of registers includes a first stage register. The first stage register is coupled to the selector to sequentially receive the test signal from the selector.

In some cases, the device further may include, but is not limited to, a shift clock generating circuit coupled to each of the plurality of registers. The shift clock generating circuit is configured to generate a shift clock from an external clock and to supply the shift clock to each of the plurality of registers. Each of the plurality of registers is configured to perform a series transfer of an associated one of the plurality of test signals, in response to the shift clock from the shift clock generating circuit.

In some cases, the device further may include, but is not limited to, a plurality of control circuits coupled to the plurality of registers, respectively. Each of the plurality of registers is configured to activate an associated one of the plurality of control circuits, in response to the shift clock from the shift clock generating circuit.

In some cases, the device further may include, but is not limited to, a counter coupled to the selector and the shift clock generating circuit. The counter is configured to define the number of selecting by the selector.

In some cases, the counter is configured to generate a shift data selecting signal by counting the shift clock, and to supply the shift data selecting signal to the selector. The selector is configured to sequentially select one of the plurality of test signals in accordance with the shift data selecting signal.

In another embodiment, a device may include, but is not limited to, a decoder, a plurality of registers, a plurality of control circuits, a selector, a counter, and a shift clock generating circuit. The decoder is configured to decode a test information and generate a plurality of signals. The plurality of registers is coupled in series to each other. The plurality of registers includes a first register on a first stage of the plurality of registers. The plurality of control circuits is coupled to the plurality of registers, respectively. The selector is coupled to the decoder and to the first stage register. The selector is configured to select a signal from the plurality of signals and supply the signal as a shift data to the first register. The counter is configured to define the number of selecting by the selector. The counter is configured to supply the selector with a selection signal which sequentially changes the signal to be selected by the selector from the plurality of signals. The shift clock generating circuit is configured to generate a shift clock having a same number of clock cycles as the number of the plurality of control circuits. The shift clock generating circuit is configured to supply the shift clock to the counter and the plurality of registers.

In some cases, the decoder is configured to generate a shift start signal with reference to the test information. The decoder is configured to supply the shift start signal to the shift clock generating circuit. The shift clock generating circuit may include, but is not limited to, a data shift state control unit and a shift clock selecting unit. The data shift state control unit is configured to generate a data shift state signal in response to the shift start signal, and to supply the data shift state signal to the shift clock selecting unit. The shift clock selecting unit may include, but is not limited to, a plurality of frequency divider circuits coupled in series to each other. The plurality of frequency divider circuits is configured to divide an external clock in accordance with the data shift state signal. The plurality of frequency divider circuits are configured to select as the shift clock the external clock or one of outputs from the plurality of frequency divider circuits. The plurality of frequency divider circuits are configured to supply the shift clocks, which correspond to the number of the clock cycle, to the counter and the plurality of registers.

In some cases, the data shift state control unit is configured to terminate supplying the data shift state signal to the shift clock selecting unit when the number of selecting by the selector reaches a given number.

In some cases, the counter is configured to count up the shift data selection signal in response to the data shift state signal and in synchronous with the shift clock. The selector may include, but is not limited to, a count decoder configured to decode the shift data selecting signal. The selector is configured to output the plurality of signals, in synchronous with the shift clock and in accordance with a result of decoding by the count decoder. The selector supplies the plurality of signals as the shift data to the first register.

In some cases, the shift data selecting signal may include, but is not limited to, a plurality of groups, each of the plurality of groups including a plurality of selecting signals which are different from other selecting signals of other groups. The count decoder includes a plurality of sub-decoders having a plurality of input nodes. The plurality of input nodes is configured to receive the plurality of input nodes. The selector may include, but is not limited to, a plurality of switches and a latch circuit. The plurality of switches is coupled in series to each other. The plurality of switches includes a final stage switch. The latch circuit is configured to receive an output from the final stage switch. Each of the plurality of sub-decoders is configured to generate an output which controls conductive and non-conductive states of an associated one of the plurality of switches. The plurality of switches is configured to be selectively switched in accordance with the shift data selecting signal to select a signal of the plurality of signals and supply the signal as data to the latch circuit. The latch circuit is configured to output the data as the shift data in synchronous with the shift clock.

In some cases, the first register is configured to fetch the shift data from the selector in synchronous with the shift clock. Each of other registers than the first register is configured to fetch data signals from a previous stage register of the other registers than the first register in synchronous with the shift clock. Each of other registers than the final register is configured to supply the data signals to a next stage register of the other registers than the final register in synchronous with the shift clock.

In some cases, the decoder is configured to generate a test signal generation signal in accordance with the test information and to supply the test signal generation signal to each of the plurality of registers. Each of the plurality of registers is configured to supply data as test control signals to an associated one of the plurality of control circuits, in response to the test signal generation signal, so that the associated one of the plurality of control circuits operates in a test operation mode that is different from a normal operation mode.

In some cases, the decoder is configured to generate a test signal monitoring signal in accordance with the test information and supply the test signal monitoring signal to each of the plurality of registers. Each of the plurality of registers may include, but is not limited to, an input register and an output register. The input register is configured to latch the test control signal output from the output register.

In some cases, the device further may include, but is not limited to, a data output terminal. The final register is configured to supply data to the data output terminal.

In some cases, the decoder is configured to generate a shift clock selecting signal in accordance with the test information and supply the shift clock selecting signal to the shift clock selecting unit. The shift clock selecting unit is configured to select as the shift clock the external clock or one of outputs from the plurality of frequency divider circuits, in accordance with the shift clock selecting signal.

In some cases, the shift clock selecting unit is configured to be synchronized with one of the shift clock and the external clock. The one of the shift clock and the external clock is selected in accordance with the shift clock selecting signal.

In some cases, the decoder is configured to a test signal input shift clock in accordance with first and second test informations associated with the test information, and to supply the test signal input shift clock to the shift clock selecting signal. The first test information defines a rising edge of the shift clock. The second test information defines a falling edge of the shift clock. The test signal input shift clock is risen when the test information is the first test information when the external clock is risen. The test signal input shift clock is fallen when the test information is the second test information when the external clock is risen. The shift clock selecting unit is configured to output the test signal shift clock as the shift clock.

In some cases, the decoder is configured to be supplied with a command and a third test information which is associated with the command. The command is to command direct input of the shift data into each of the plurality of registers. The selector is configured to output high or low logic in accordance with fourth and fifth test informations. The fourth test information defines high logic of the output from the selector. The fifth test information defines low logic of the output from the selector. The fourth and fifth test informations are to be supplied subsequent to the third test information. The decoder is configured to generate the test signal shift clock in accordance with the first and second test informations and supply the test signal shift clock to the shift clock selecting unit in a period of time to maintain the output from the sector to be high or low. The shift clock selecting unit is configured to output the test signal input shift clock as the shift clock.

In some cases, the shift clock selecting unit is configured to terminate frequency dividing operation by the plurality of frequency divider circuits in accordance with the shift clock selecting signal.

In some cases, the device further may include, but is not limited to, a memory cell array including a plurality of memory cells; and a peripheral circuit configured to control the plurality of memory cells. The plurality of control circuits are distributed over at least one of the memory cell array and the peripheral circuit. Each of the plurality of registers is disposed adjacent to an associated one of the plurality of control circuits.

A semiconductor device includes a decoder that decodes test information supplied from outside the semiconductor device when testing the semiconductor device and generates a plurality of signals, a plurality of registers that are cascade-connected by mutual connection between the input nodes and the output nodes thereof, a plurality of control circuits that are each connected respectively to a corresponding output node of the plurality of registers, a selector, to which the plurality of signals are supplied, that selectively supplies one signal of the plurality of signals as shift data to an input node of a first register that is the first stage of the plurality of registers, a counter that establishes the number of selectings of the selector and that successively switches the selection destination of the plurality of signals for each of the plurality of selectings of the selector in a time sequence, and a shift clock generating circuit that generates a shift clock that has a number of clock cycles that corresponds to the number of the plurality of control circuits, and supplies the result to the plurality of registers and to the counter.

According to the embodiment of the present invention, when a plurality of test signals generated by the decoder are transferred to each of the mutually cascade-connected plurality of registers, the selector, by a shift data selector signal that is the result of the counter counting the shift clock, sequentially selects one from the plurality of test signals, and supplies the test signal to the first register of the plurality of registers. That is, with the number of selecting established by the counter, the selector supplies all of the plurality of test signals sequentially to the first register of the plurality of registers. The shift clock generating circuit supplies to the plurality of registers a number of shift clocks that is the number of control circuits. Each time a shift clock is supplied, each of the plurality of registers to which the shift clock is supplied sequentially transfers the plurality of test signals supplied from the selector, and when the number of shift clocks that is the number of control circuits has been supplied, each register receives a test signal that activates a control circuit to which it is connected.

By doing this, a register unit (the above-noted first register unit) that receives each of the plurality of test signals from the decoder is not necessary. Also, because compared with the number of elements in a plurality of master-slave type flip-flops constituting the first register unit, it is sufficient to have only a small number of selector elements according to the present invention, compared with a semiconductor device having a register unit (the above-noted first register unit) that receives each of the test signals from the decoder, it is possible to reduce the scale of the test circuit and possible to suppress an increase in the chip size of the semiconductor device.

In the above-noted shift clock generating circuit, in the case in which the external clock CK has a high frequency, by adopting a constitution that makes the shift clock a low-frequency clock, it is not necessary to use a design that provides a clock tree within the semiconductor device and maintains synchronization between shift clocks at each register, thereby enabling a reduction in the scale of the circuitry for the constitution of a clock tree, so that an increase in the semiconductor device chip size can be suppressed.

Also, by connecting the last stage of the above-noted plurality of registers to an external terminal of the semiconductor device and transferring the register data, the monitorability (function enabling verification from outside of the logic levels of test signals) of a semiconductor device having a test circuit is improved and, in the test circuit, it is possible to detect whether or not the test signals are being properly transferred to the registers.

EMBODIMENTS

A typical embodiment of the present invention is described below, using FIG. 1. It shall be understood, however, that the claims of the present invention are not restricted to this technical concept, and encompasses the language of the claims for the present invention.

Figure 1:
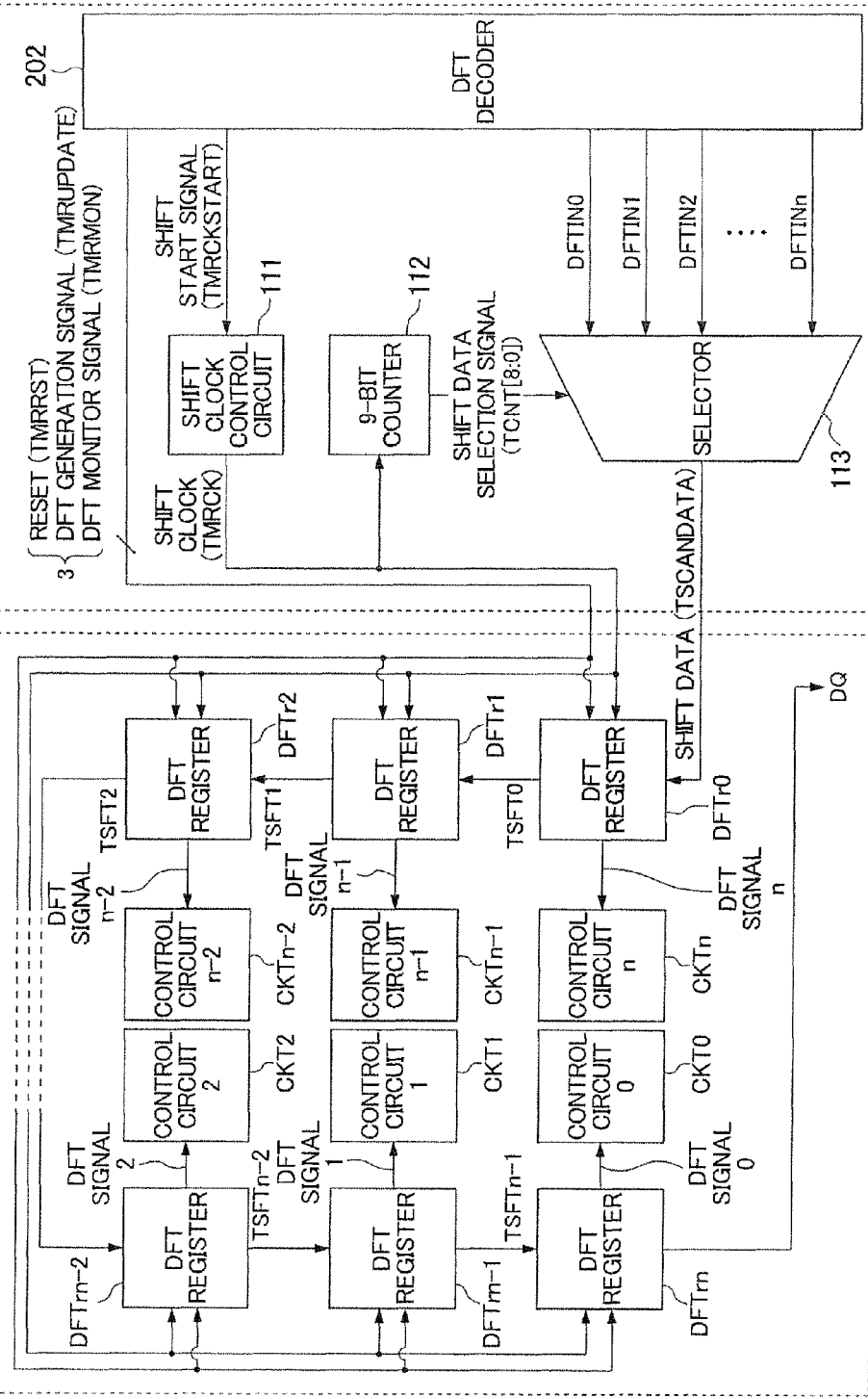
FIG. 1 is a block diagram of a test circuit in accordance with an embodiment of the present invention.

FIG. 1 is a drawing for describing the technical concept of the present invention, this generally showing the circuit related to testing operation extracted from the constitution of the semiconductor device 100 of an embodiment of the present invention.

In FIG. 1, of the semiconductor device 100, which is described later, a boundary scan control circuit 211 and a test control circuit 212 are shown.

The boundary scan control circuit 211 is constituted by a DFT decoder 202, a shift clock control circuit 111, a 9-bit counter 112, and a selector 113. The test control circuit 212 is constituted by a plurality of DFT registers DFTri ($0 \leq i \leq n$) that are mutually cascade-connected, and a plurality of control circuits CKT(n–i) that correspond respectively to these plurality of registers. The number of the plurality of control circuits CKT to be controlled in testing is several hundred circuits, and also the plurality of control circuits CKT are disposed in a distributed manner in various locations in the semiconductor chip. The plurality of control circuits CKT are disposed in a distributed manner in the memory array that includes a plurality of memory cells, which are storage elements. The plurality of control circuits CKT are disposed in distributed manner in the peripheral circuitry that controls the memory cell array. This is the same as well for the plurality of DFT registers DFTri corresponding to the plurality of control circuits CKT.

Each of the control circuits CKT(n–i), in testing, receives a test control signal DFT(n–i) from a DFT register DFTri to which it is connected, and outputs this to a circuit that is to be controlled.

The DFT decoder 202, in response to test information (a test code signal) input from the outside, generates test signals DFTINi, which are signals having the same logic level as the test control signals DFTi.

In this case, a circuit that can be envisioned as being controlled by the control circuit CKT in testing is, for example, a delay circuit in a DRAM or the like that either advances or delays the timing of sense amplifier activation. In the usual operating mode, after a word line is selected and a sufficiently different potential occurs on a pair of bit lines, the sense amplifier is activated. However, there are cases in which a cell having a small memory cell capacitance is formed because of manufacturing variations, and with the timing settings in the usual operating mode, a memory cell having a small capacitance might be judged to be a good memory cell, although deterioration of the memory cell characteristics after shipping of the product could cause this to become a malfunctioning memory cell. Given this, in the above-noted delay circuit, if a switch or the like is provided and the timing of sense amplifier activation is advanced, in the direction that removes the operating margin of the DRAM, it is possible to perform an accelerated test in which memory cells having a high possibility of becoming malfunctioning memory cells after product shipping can be detected and rejected beforehand. Also, with regard to post-design evaluation, in the case in which there is no DRAM operating margin, by delaying the timing of the sense amplifier activation, it is possible to verify whether the operating margin broadens when the sense amplifier activation timing is delayed. For this reason, the test control signals DFTi are used as a signal that controls the delay circuit switch.

A DRAM or the like generally has an internal voltage generating circuit, the output of the internal voltage generating circuit causing operation of the memory cells. In order to reject initial failures in reliability testing, the memory cells are operated with high voltage that is different than at the time of shipping. In this case, the provision of a bypass switch that connects the internal voltage generating circuit to a circuit or the like that generates a different voltage can be envisioned for switched operation. In post-design evaluation, in the case in which there is no DRAM operating margin, by making the output of the internal voltage generating circuit high or low, it is possible to verify how the operating margin changes. For this reason, the test control signals DFTi are used as signals that control the above-noted bypass switch.

The DFT decoder 202 is a circuit that, in response to input test information (a test code signal), generates the above-described test signals DFTINi or the like. As the number of tests increases, however, because the number of test signals DFTINi also increases, the surface area of the interconnect region for the test signals DFTINi or the like increases, thereby leading to an increase in the chip size or hindering of a reduction of the chip size.

Given the above, the technical concept of the semiconductor device of the present invention is that of, rather than directly inputting the test signals DFTINi to the control circuits CKTi, using the constitution described below to reduce the interconnect regions required for the test signals.

That is, in the semiconductor device of the present invention, the shift clock control circuit 111 generates a number of shift clocks TMRCK that corresponds to the number of control circuits CKT0 to CKTn, and supplies them to a plurality of DFT registers DFTri ($0 \leq i \leq n$) and to the 9-bit counter 112.

The 9-bit counter 112, in synchronization with the shift clock TMRCK, outputs to the selector 113 the number of selectings of the selector 113, that is, the shift data selection signal TCNT[8:0] that establishes the number of outputs of the shift data TSCANDATA.

The selector 113, based on the shift data selection signal TCNT[8:0], sequentially selects one of the test signals DFTINi, which is a plurality of signals, and supplies it to the first register (DFT register DFTr0) of the plurality of cascade-connected registers as the shift data TSCANDATA.

When a shift clock TMRCK corresponding to the number (n+1) of the plurality of respective control circuits is input, the plurality of cascade-connected DFT registers DFTri serially transfer the shift data TSCANDATA.

By doing this, the test signal DFTIN0 is transferred to the DFT register DFTrn, the test signal DFTIN1 is transferred to the DFT register DFTr(n−1), . . . , the test signal DFTIN(n−1) is transferred to the DFT register DFTr1, and the test signal DFTINn is transferred to the DFT register DFTr0.

Each of the DFT registers DFTr(n−i) holds a test signal DFTINi, and when the active-level DFT generation signal TMRUPDATE (the DFT generation signal in FIG. 1) is input, the test signal DFTINi is output to the corresponding one of the plurality of control circuits CKTi as the test control signal DFTi.

A preferable embodiment of the present invention is described in detail below, with references made to the drawings.

Figure 2:
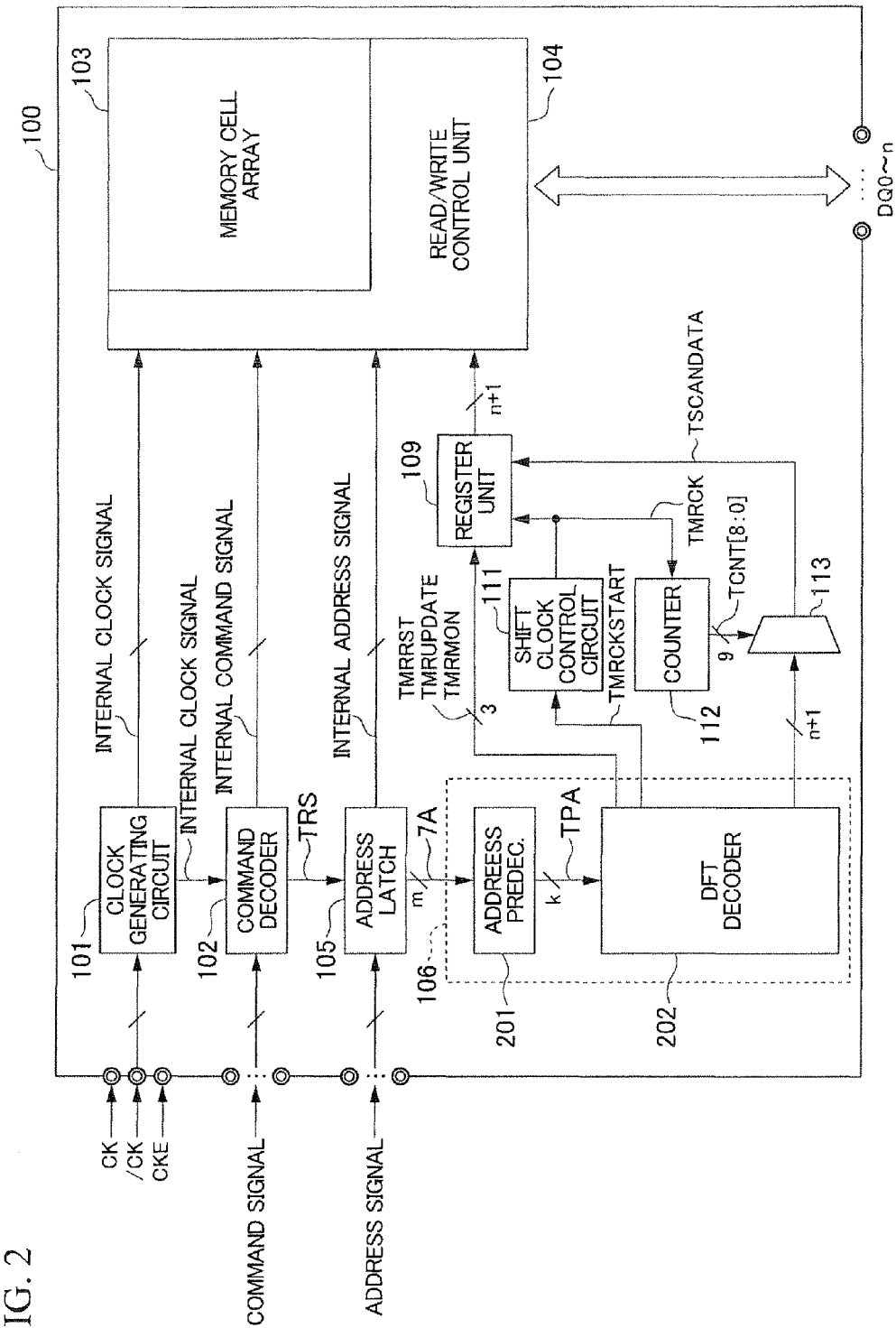
FIG. 2 is a block diagram of a semiconductor device including the test circuit of FIG. 1.

FIG. 2 is a simplified block diagram showing the constitution of the semiconductor device 100 according to an embodiment of the present invention. In this case, a semiconductor memory device is used as an example. The semiconductor device 100 has a clock generating circuit 101, a command decoder 102, a memory cell array 103, a read/write control unit 104, an address latch 105, a decoder unit 106, a register unit 109, a shift clock control circuit 111, a 9-bit counter 112, and a selector 113.

A clock signal CK, an inverse clock signal /CK that is a complementary signal of the clock signal CK, and a clock enable signal CKE, which indicates whether or not the input clock signal CK and the inverse clock signal /CK are enabled, are input to the clock generating circuit 101. The clock generating circuit 101, in response to the input clock signal CK, inverse clock signal /CK, and clock enable signal CKE, supplies an internal clock signal that is synchronized with the external clock signal CK to the read/write control unit 104, which is internal circuitry of the semiconductor device 100. The clock generating circuit 101 supplies the internal clock signal that is synchronized with the external clock signal CK to the command decoder 102.

The command decoder 102, after latching command signals (chip select signal CSB, row address strobe signal RASB, column address strobe signal CASB, and write enable WEB) in synchronization with the internal clock signal, decodes the commands and outputs control signals (internal command signals) instructing an operation to the read/write control unit 104 according to the decoding results. When a test command (MRS command) is input, the command decoder 102 outputs a test command signal TRS in synchronization with the internal clock signal to the address latch 105.

The memory cell array 103 is constituted by arrangement of a plurality of word lines, a plurality of bit lines, and a plurality of memory mats made of a plurality of memory cells provided at the intersections of the plurality of word lines and the plurality of bit lines.

The memory cell array 103 has a plurality of sense amplifiers that perform operations such as amplifying data read out from a memory cell to a bit line, a plurality of word drivers that drive the plurality of word lines, and a plurality of Y switches connected to the bit and I/O lines. The sense amplifiers are circuits that, in the read-out operation, amplify the weak data signals that appear on the bit lines from the memory cell. They are also the circuits that, in the write operation, write data to a memory cell via a bit line. The operational timing of the sense amplifiers is controlled by a sense amplifier drive signal that is output from the X decoder and X timing circuit to be described later. The timing of the opening and closing of the Y switch is controlled by the Y decoder and Y timing circuit to be described later. In a read operation, the I/O line, by opening the Y switch, reads data out from the bit line and transfers the data to the read/write control unit 104 disposed outside the memory cell array 103. In a write operation, the I/O line, transfers write data from the read/write control unit 104 to the bit line.

The read/write control unit 104 is a control unit that controls the operation of the memory cell array 103, and has an X decoder and X timing circuit, and a Y decoder and Y timing circuit and the like.

The X decoder and X timing circuit decode the row address (internal address signal) input from the address latch 105 and, responsive to the results of the decoding, select a memory cell of the memory cell array 103 by using a word line. The X decoder and X timing circuit also performs control of the timing of the operation of the sense amplifier, which amplifies the differential potential on the bit line.

The Y decoder and Y timing circuit decode the column address (internal address signal) input from the address latch 105 and, responsive to the results of the decoding, control the timing of the selection of the Y switch that intervenes between the bit line and the I/O line. The Y decoder and Y timing circuit, in synchronization with the input internal clock signal from the clock generating circuit 101 and in response to an internal command signal input from the command decoder 102, controls the operation of reading out data from a selected memory cell via the I/O line, or the operation of writing data to a selected memory cell via the I/O line. The Y decoder and Y timing circuit output the memory cell data to the outside as DQ signals (DQ0 to n). A data circuit writes a DQ signal input from outside as data into a memory cell. These read and write operations are also performed in synchronization with the internal clock signal.

In this manner, the read/write control unit 104 has an X decoder and X timing circuit, and a Y decoder and Y timing circuit. The X decoder and X timing circuit, and the Y decoder and Y timing circuit further have a circuit that has a test operation mode that is set for a test operation by a signal output by the control circuit CKT, and in a test operation the operation of the memory cell array 103 is controlled.

The circuit that is controlled by the signal output from the control circuit CKT is a circuit that changes the timing (for example, a delay circuit embedded beforehand in the signal control system for the circuit for advancing or delaying the drive timing of the sense amplifier or for the control of performing other read/write operations).

A circuit controlled by the signal output by the control circuit CKT is a circuit that changes the voltage level of the internal voltage generating power supply circuit (for example, a circuit capable of switching an internal reference voltage input to the internal voltage generating power supply circuit to a higher voltage or a lower voltage, by the output of the control circuit CKT).

A circuit controlled by the signal output by the control circuit CKT is a circuit that makes the signal output by the control circuit CKT enabled or disabled so as to change the circuit operation. (This is the circuit that can activate by a signal output by the control circuit CKT a circuit that had originally been inactive, or can inactivate by the signal output from the control circuit CKT a circuit that had originally been active.)

In a read or write operation, the address latch 105 latches an address signal input from the outside in synchronization with the internal clock signal, and supplies the internal address signal to the X decoder and X timing circuit and the Y decoder and Y timing circuit of the read/write control unit 104. In a test operation, the address latch 105 latches an address signal (test code signal) input from the outside by the test command signal TRS in synchronization with the internal clock signal, and supplies a test address signal TA to the decoder unit 106.

The decoder unit 106 has an address pre-decoder 201 and a DFT decoder 202. The address pre-decoder 201 is input thereto an m-bit test address signal TA from the address latch 105, and supplies k test pre-address signals TPA to the DFT decoder 202. In this case, the address pre-decoder 201 divides the m-bit test address signal TA into a plurality of groups, decodes the test address signal TA in each group, and outputs the signals resulting from the decoding to the DFT decoder 202. For example, in the case of an 8-bit test address signal TA, the address pre-decoder 201 divides into three groups of 2 bits, 3 bits, and 3 bits. Then, the address pre-decoder 201 outputs to the DFT decoder 202 the signals of 4-bit, 8-bit, and 8-bit decoding results from each of the groups. In this manner, the relationship between the number of bits m of the test address signal TA and the number k of test pre-address signals TPA is k>m.

The DFT decoder 202 generally is constituted by AND circuits, and decodes the test pre-address signal TPA input from the address pre-decoder 201, generates the test signals DFTIN0 to DFTINn, and outputs them to the selector 113. In this case, although the DFT decoder 202 can generate up to a maximum of $2^k$ DFT signals, in FIG. 2, it is made to generate (n+1) test signals DFTINi ($0 \leq i \leq n$).

When the shift start signal TMRCKSTART input from the DFT decoder 202 changes to the active level (high level) the shift clock control circuit 111 outputs the shift clock TMRCK to the 9-bit counter 112 and the register unit 109. The 9-bit counter 112 and the register unit 109 execute an internal operation in synchronization with the shift clock TMRCK. The constitution and the operation of the shift clock control circuit 111 will be described later.

The 9-bit counter 112 is a 9-bit counter that outputs to the selector 113 shift data selection signal TCNT[8:0] that establishes the number selecting of the selector 113.

The selector 113, in response to the counter signal CNT[8:0], sequentially outputs to the register unit 109 a plurality of test signals DFTINi ($0 \leq i \leq n$) as the shift data TSCANDATA.

The constitution and operation of the 9-bit counter 112 and the selector 113 will be described later.

The register unit 109, in synchronization with the shift clock TMRCK input from the shift clock control circuit 111, performs a number of shift operations that is the number of clock cycles corresponding to the number of control circuits CKT. At the end of the shifting operation, when a high-level DFT generation signal TMRUPDATE is input from the DFT decoder 202, the register unit 109 outputs the data (test signal DFTIN(n−i)) that is held in each of the plurality of DFT registers DFTri ($0 \leq i \leq n$) as the control signals DFT(n−i) to the corresponding control circuits CKT(n−i) in the read/write control unit 104.

Additionally, when a DFT monitor signal TMRMON is input from the DFT decoder 202, each of the DFT registers DFTri($0 \leq i \leq n$) in the register unit 109 captures and holds the test control signal DFT(n−i) output to the control circuits (CKT(n−i)) in the read/write control unit 104.

When a reset signal TMRRST is input from the DFT decoder 202, the register unit 109 is initialized.

The register control signals (TMRUPDATE, TMRMON, and TMRRST) input to the register unit 209 are signals that are generated by the decoder unit 106 using the text address signal TPA.

The read/write control unit 104 has control circuits CKTi (0≤i≤n). The input of each of the control circuits CKTi is connected to the output of a respective DFT register DFTr(n−i) in the register unit 109, and has input to it a test control signal DFT(n−i).

In a test operation, each of the control circuits CKTi, as described above, by its output signals sets the test operation mode of circuits such as a circuit that changes the timing, a circuit that changes the voltage level of the internal voltage generating power supply circuit, and a circuit that changes the circuit operation to enable or disable a control signal.

Next, the constitution and operation of the register unit 109 will be described, using FIG. 1, FIG. 3, and FIG. 4. FIG. 3 shows the constitution of the register unit 109 and a circuit diagram of an internal DFT register DFTrn. FIG. 4 is a timing diagram used to describe the operation of the register unit 109.

As shown in FIG. 1, the register unit 109 is constituted by a plurality of DFT registers DFTri (0≤i≤n). The DFT register DFTr0 is connected to the selector 113 and has input to it the shift data TSCANDATA. The input of each of the DFT registers DFTri (1≤i≤n) is connected to the output of the previous stage of DFT register DFTri−1, and the output signal TSFTi−1 of the previous stage of DFT register is input thereto. The final stage of DFT register DFTrn is connected to the input of an output buffer circuit (not shown) (which will be referred to hereinafter as the buffer circuit DoutBuf). The register output signal TSFTn is input to the input of the buffer circuit DoutBuf and, when the buffer circuit DoutBuf is activated, the register output signal TSFTn is output to the external output terminal DQ of the semiconductor device 100. The buffer circuit DoutBuf is activated with the input of the data shift state signal TMRSFTEN having an active level that is generated by the decoder unit 106 using the test pre-address signal TPA, and is deactivated by a data shift state signal TMPSFTEN having an inactive level (low level).

Each of the plurality of DFT registers DFTri (0≤i≤n), in addition to having a terminal that outputs a register output signal TSFTi, has a terminal that outputs a test control signal DFT (n−i) to the control circuit CKTi. The DFT register DFTri outputs a test control signal DFT(n−i) to the control circuit CKT(n−i) (refer to FIG. 1).

Figure 3B:
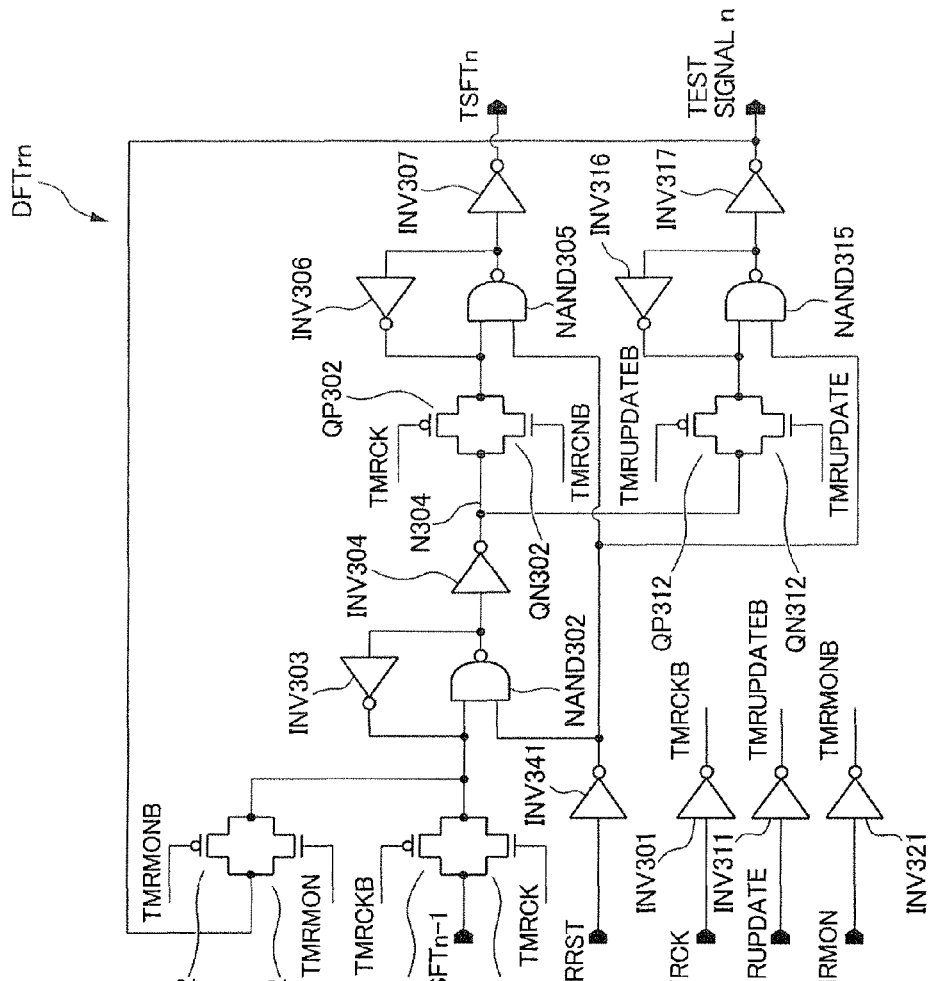
FIG. 3B is a circuit diagram of a configuration of an DFT register included in the registers of FIG. 3A.
Figure 3A:
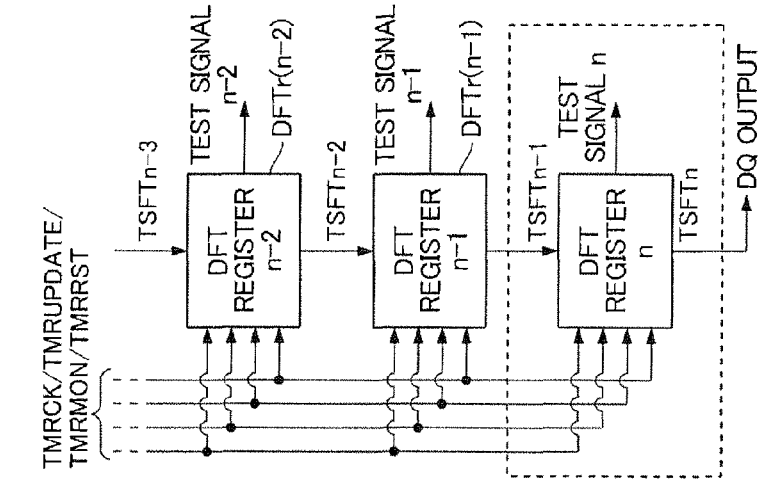
FIG. 3A is a circuit diagram of a configuration of registers included in the semiconductor device of FIG. 2.
Figure 4:
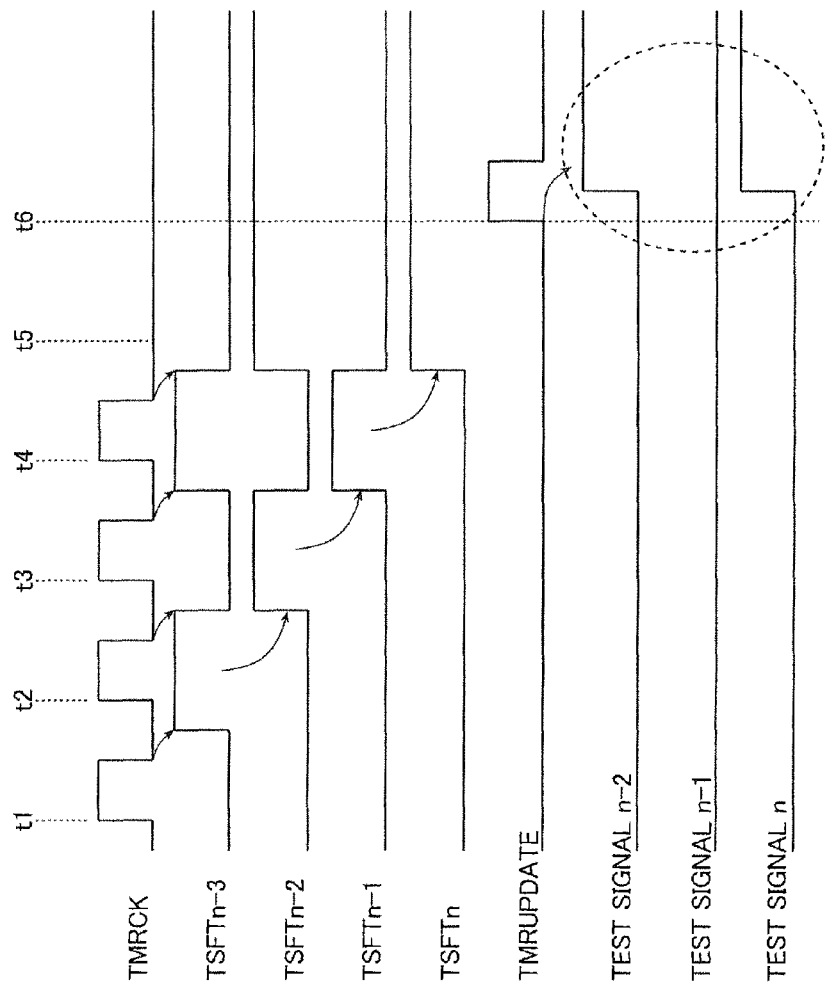
FIG. 4 is a timing chart illustrating operations of the registers of FIGS. 3A and 3B.

FIG. 3A shows the connection of three DFT registers, including the final stage for the case in which the register unit 109 is constituted by (n+1) stages of DFT registers, and FIG. 3B shows the circuit specific configuration of a DFT register DFTrn. The test control signal DFTn shown in FIG. 3 (test signal n in the drawing), the test control signal DFTn−1 (test signal n−1 in the drawing), the and the test control DFTn−2 (test signal n−2 in the drawing) each correspond to the DFT signal 0, DFT signal 1, and DFT signal 2 shown in FIG. 1.

As shown in FIG. 3B, the DFT register DFTrn has an inverter circuit INV301 that logically inverts the shift clock TMRCK and outputs an inverted signal TMRCKB.

Also, as shown in FIG. 3B, the DFT register DFTrn has a p-channel MOS transistor QP301, an n-channel MOS transistor QN301, a NAND circuit NAND302, an inverter circuit INV303, an inverter circuit INV304, a p-channel MOS transistor QP302, an n-channel MOS transistor QN302, a NAND circuit NAND305, an inverter circuit INV306, and an inverter circuit INV307.

Next, the connections of these circuits and the shift operation of the register unit 109 will be described.

In the description to follow, the description is for the case in which the reset signal TMRRST is at the low level (inactive level), and the output of the inverter circuit INV341 that logically inverts the reset signal TMRRST is the high level.

When the shift clock TMRCK changes to the active level (high level) and the inverted signal TMRCKB changes to the active level (low level), the transfer gate (which will be called TG1) constituted by the p-channel MOS transistor QP301 and the n-channel MOS transistor QN301 turns on.

As a result, the transfer gate TG1 captures the register output signal TSFTn−1 of the DFT register DFTr(n−1) of the previous stage and transfers it to the NAND circuit NAND302.

If the register output signal TSFTn−1 is the high level, the NAND circuit NAND302 outputs a low-level signal. Because it receives a low-level input signal, the inverter circuit INV304 makes the internal node N304 in the register high level. If the register output signal TSFTn−1 is the low level, however, the NAND circuit NAND302 outputs a high-level signal. Because it receives a high-level input signal, the inverter circuit INV304 makes the internal node N304 in the register low level. In this manner, the DFT register DFTrn captures the register output signal TSFTn−1 of the previous stage of DFT register DFTr(n−1) at the internal node N304 during the period in which the shift clock TMRCK is at the active level (high level).

When the shift clock TMRCK changes to the inactive level (low level) and the inverted signal TMRCKB changes to the inactive level (high level), the transfer gate (which will be called TG2) constituted by the p-channel MOS transistor QP302 and the n-channel MOS transistor QN302 turns on.

The result is that the transfer gate TG2 transfers the logic level of the internal node N304 to the NAND circuit NAND305. If the internal node N304 is at the high level, a low-level signal is output by the NAND circuit NAND305. Because it receives a low-level input signal, the inverter circuit INV307 makes the register output signal TSFTn high level. If the internal node N304 is low level, however, the NAND circuit NAND305 outputs a high-level signal. Because it receives a high-level input signal, the inverter circuit INV307 makes the register output signal TSFTn low level. In this manner, when the shift clock TMRCK changes to the inactive level (low level), the DFT register DFTrn outputs a signal having the same logic level as the internal node N304 as its own register output signal TSFTn.

That is, during the period in which the shift clock TMRCK is at the active level (high level), the DFT register DFTrn captures the register output signal TSFTn−1 of the previous stage at the internal node N304, and when the shift clock TMRCK changes to the inactive level (low level), it outputs the register output signal TSFTn. Therefore, if the shift clock TMRCK is input to the register unit 109 (n+1) times, during the (n+1)th time of the high level of the shift clock TMRCK the test signal DFTIN(n−1) output by the DFT decoder 202 is captured at the internal node N304 of each of the DFT registers DFTri (0≤i≤n) that constitute the register unit 109. After the shift clock TMRCK is input (n+1) times, when the shift clock TMRCK changes to the low level, each of the DFT registers DFTri outputs the test signal DFTIN(n−i) as the register output signal TSFTi.

As shown in FIG. 3B, the DFT register DFTrn has an inverter circuit INV311 that logically inverts the DFT generation signal TMRUPDATE and outputs the inverted signal TMRUPDATEB.

As shown in FIG. 3B, the DFT register DFTrn also has a p-channel MOS transistor QP312, an n-channel MOS transistor QN312, a NAND circuit NAND315, an inverter circuit INV316, and an inverter circuit INV317.

When the DFT generation signal TMRUPDATE changes to the active level (high level) and the inverted signal TMRUPDATEB changes to active level (low level), the transfer gate (which will be called TG3) constituted by the p-channel MOS transistor QP312 and the n-channel MOS transistor QN312 (hereinafter TG3) turns on.

The result is that the transfer gate TG3 transfers the logic level of the internal node N304 to the NAND circuit NAND315. If the internal node N304 is at the high level, the NAND circuit NAND315 outputs a low-level signal. Because it receives a low-level input signal, the inverter circuit INV317 makes the test control signal DFTn (test signal n in the drawing) high level. If the internal node N304 is low level, however, the NAND circuit NAND315 outputs a high-level signal. Because it receives a high-level input signal, the inverter circuit INV317 makes the test control signal DFTn (test signal n in the drawing) low level. In this manner, when the DFT generation signal TMRUPDATE changes to the active level (high level), the DFT register DFTrn outputs a signal having the same logic level as the internal node N304 as the test control signal DFTn (test signal n in the drawing).

Therefore, in the register unit 109, when the shift clock TMRCK is input (n+1) times and then the shift clock TMRCK changes to the low level, by making the DFT generation signal TMRUPDATE the active level (high level), each of the plurality of DFT registers DFTri (0≤i≤n) outputs a test signal DFTIN(n−i) already held at each internal node N304 to the control circuit CKT (n−i) as the test control signal DFT(n−i).

As shown in FIG. 3B, the DFT register DFTrn has an inverter circuit INV321 that logically inverts the DFT monitor signal TMRMON and outputs an inverted signal TMRMONB.

As shown in FIG. 3B the DFT register DFTrn has a p-channel MOS transistor QP322 and an n-channel MOS transistor QN322.

When the DFT monitor signal TMRMON changes to the active level (high level) and the inverted signal TMRMONB changes to the active level (low level), the transfer gate constituted by the p-channel MOS transistor QP322 and the n-channel MOS transistor QN322 (hereinafter TG4) turns on.

As a result, the transfer gate TG4 captures the test control signal DFTn (test signal n in the drawing) and transfers it to the NAND circuit NAND302. If the test control signal DFTn (test signal n in the drawing) is at the high level, the NAND circuit NAND302 outputs a low-level signal. Because it receives a low-level input signal, the inverter circuit INV304 makes the internal node N304 in the register high level. If the control signal DFTn (test signal n in the drawing) is at the low level, however, the NAND circuit NAND302 outputs a high-level signal. Because it receives a high-level input signal, the inverter circuit INV304 makes the internal node N304 in the register low level. In this manner, during the period in which the DFT monitor signal TMRMON is at the active level (high level), the DFT register DFTrn captures the test control signal DFTn (test signal n in the drawing) that it itself outputs at the internal node N304.

When this occurs, because the shift clock TMRCK is at the inactive level (low level) and the inverted signal TMRCKB is at the inactive level (high level), the transfer gate TG2 transfers the logic level of the internal node N304 to the NAND circuit NAND305. If the internal node N304 is at the high level, the NAND circuit NAND305 outputs a low-level signal. Because it receives a low-level input signal, the inverter circuit INV307 makes the register output signal TSFTn high level. If the internal node N304 is at low level, however, the NAND circuit NAND305 outputs a high-level signal. Because it receives a high-level input signal, the inverter circuit INV307 makes the register output signal TSFTn low level. In this manner, because the shift clock TMRCK is at the inactive level (low level), the DFT register DFTrn outputs a signal having the same logic level as the test control signal DFTn (test signal n in the drawing) as its own register output signal TSFTn.

FIG. 4 is a timing chart showing the shift operation of the above-described register unit 109 and the operation of activating the test signal (operation of enabling the test control signal and setting the test operating mode into the control circuit), this showing the operation of the three stages of DFT registers, including the final stage, of the register unit 109 shown in FIG. 3A.

FIG. 4 shows the change of the logic levels of the shift clock TMRCK, the register output signals TSFTn−3 to TSFTn, the DFT generation signal TMRUPDATE, and the test control signals DFTn−3 (test signal n−3 in the drawing) to DFTn (test signal n in the drawing). FIG. 4 shows the operation in the case in which the DFT decoder 202 outputs a high-level test signal DFTIN0, a low-level test signal DFTIN1, a high-level test signal DFTIN2, and a low-level test signal DFTIN3.

In FIG. 4, the period between time t1 and time t2 is the (n−2)th cycle of the shift clock TMRCK output by the shift clock control circuit 111. The period between time t2 and time t3 is the (n−1)th cycle of the shift clock TMRCK output by the shift clock control circuit 111. The period between time t3 and time t4 is the (n)th cycle of the shift clock TMRCK output by the shift clock control circuit 111. The period between time t4 and time t5 is the (n+1)th cycle of the shift clock TMRCK output by the shift clock control circuit 111.

At time t1, the DFT register DFTr(n−3) (not shown) captures the high-level register output signal TSFTn−4 of the previous-stage DFT register DFTr(n−4), and makes its own internal node N304 high level. Next, when the shift clock TMRCK changes to the low level, the DFT register DFTr(n−3), as shown in FIG. 4, outputs a high-level register output signal TSFTn−3, which is the same level as the internal node N304. This high-level register output signal TSFTn−3 is a signal corresponding to the high-level test signal DFTIN0.

At time t2, when the shift clock TMRCK changes to the high level, the DFT register DFTr(n−2) captures the high-level register output signal TSFTn−3, and makes its own internal node N304 high level. Also, when the shift clock TMRCLK changes to the low level, the DFT register DFTr (n−2), as shown in FIG. 4, then outputs the high-level register output signal TSFTn−2. This high-level register output signal TSFTn−2 is a signal corresponding to the high-level test signal DFTIN0.

At time t2, the DFT register DFTr(n−3) (not shown) captures the low-level register output signal TSFTn−4 of the previous stage DFT register DFTr(n−4) and makes its own internal node N304 low level. Next, when the shift clock TMRCK changes to the low level, the DFT register DFTr(n−3), as shown in FIG. 4, outputs a low-level register output signal TSFTn−3, which is the same level as the internal node N304. This low-level register output signal TSFTn−3 is a signal corresponding to the low-level test signal DFTIN1.

At time t3, when the shift clock TMRCK changes to the high level, the DFT register DFTr(n−1) captures the high-level register output signal TSFTn−2 and makes its own internal node N304 high level. Then, when the shift clock TMRCK changes to the low level, the DFT register DFTr(n−1), as shown in FIG. 4, then outputs a high-level register output signal TSFTn−1. This high-level register output signal TSFTn−1 is a signal corresponding to the high-level test signal DFTIN0.

At time t3, when the shift clock TMRCK changes to the high level, the DFT register DFTr(n−2) captures a low-level register output signal TSFTn−3, and makes its own internal node N304 low level. Next, when the shift clock TMRCK changes to the low level, the DFT register DFTr(n−2), as shown in FIG. 4, outputs a low-level register output signal TSFTn−2. This low-level register output signal TSFTn−2 is a signal corresponding to the low-level test signal DFTIN1.

At time t3, the DFT register DFTr(n−3) (not shown) captures the high-level register output signal TSFTn−4 of the previous stage DFT register DFTr(n−4), and makes its own internal node N304 high level. Next, when the shift clock TMRCK changes to the low level, the DFT register DFTr(n−3), as shown in FIG. 4, outputs a high-level register output signal TSFTn−3, which is the same level as the internal node N304. This high-level register output signal TSFTn−3 is a signal corresponding to the high-level test signal DFTIN2.

At time t4, when the shift clock TMRCK changes to the high level, the DFT register DFTrn captures the high-level register output signal TSFTn−1, and makes its own internal node N304 high level. When the shift clock TMRCK then changes to the low level, as shown in FIG. 4, the DFT register DFTrn outputs a high-level register output signal TSFTn. This high-level register output signal TSFTn is a signal corresponding to the high-level test signal DFTIN0.

At time t4, when the shift clock TMRCK changes to the high level, the DFT register DFTr(n−1) captures the low-level register output signal TSFTn−2, and makes its own internal node N304 low level. Then, when the shift clock TMRCK changes to the low level, as shown in FIG. 4, the DFT register DFTr(n−1) outputs a low-level register output signal TSDFTn−1. This low-level register output signal TSFTn−1 is a signal corresponding to the low-level test signal DFTIN1.

At time t4, when the shift clock TMRCK changes to the high level, the DFT register DFTr(n−2) captures the high-level register output signal TSFTn−3, and makes its own internal node N304 high level. Then, when the shift clock TMRCK changes to the low level, as shown in FIG. 4, the DFT register DFTr(n−2) outputs a high-level register output signal TSFTn−2. This high-level register output signal TSFTn−2 is a signal corresponding to the high-level test signal DFTIN2.

At time t4, the DFT register DFTr(n−3) (not shown) captures the low-level register output signal TSFTn−4 of the previous stage DFT register DFTr(n−4), and makes its own internal node N304 low level. Then, when the shift clock TMRCK changes to the low level, as shown in FIG. 4, the DFT register DFTr(n−3) outputs a low-level register output signal TSFTn−3, which is the same level as the internal node N304. This low-level register output signal TSFTn−3 is a signal corresponding to the low-level test signal DFTIN3.

In this manner, when the shift clock TMRCK is input (n+1) times, each of the DFT registers DFTri (0≤i≤n) constituting the register unit 109 sequentially transfers the test signal DFTINi output by the DFT decoder 202 to the next stage DFT register, and after (n+1) inputs, the register output signal TSFTi is output.

As will be described later, after generation of (n+1) shift clocks has been completed, the shift clock control circuit 111, the shift clock TMRCK is held at the low level, so that, at each the DFT registers DFTri of the register unit 109, TG1 is off, and each of the DFT registers DFTri holds a test signal DFTINi at its respective internal node N304.

For this reason, in this condition, when the DFT generation signal TMRUPDATE is made the active level (high level), at each of the DFT registers DFTri, the TG3 is on, and each of the DFT registers DFTri outputs a test control signal DFT(n−i) to the control circuit CKT(n−i).

Returning to FIG. 4, at time t6, when an active-level (high-level) DFT generation signal TMRUPDATE is input, each of the DFT registers DFTr(n−2) to DFTrn outputs a high-level test control signal DFTn−2 (test signal n−2 in the drawing), a low-level test control signal DFTn−1 (test signal n−1 in the drawing), and a high-level test control signal DFTn (test signal n in the drawing).

In this manner, when an active-level (high-level) DFT generation signal TMRUPDATE is input, each of the plurality of DFT registers DFTri (0≤i≤n) that constitute the register unit 109 outputs the test signal DFTIN(n−i) output by the DFT decoder 202 to the control circuit CKT(n−i) as the test control signal DFT(n−i). The delay circuits and the like connected to each of the control circuits CKTi are set to the test operating mode, and in the test operation the read/write control unit 104 operates with a timing that is different from the normal timing.

Next, the shift clock control circuit 111 that generates the shift clock TMRCK used in data transfer in the register unit 109 will be described, using FIG. 5 and FIG. 6.

Figure 5:
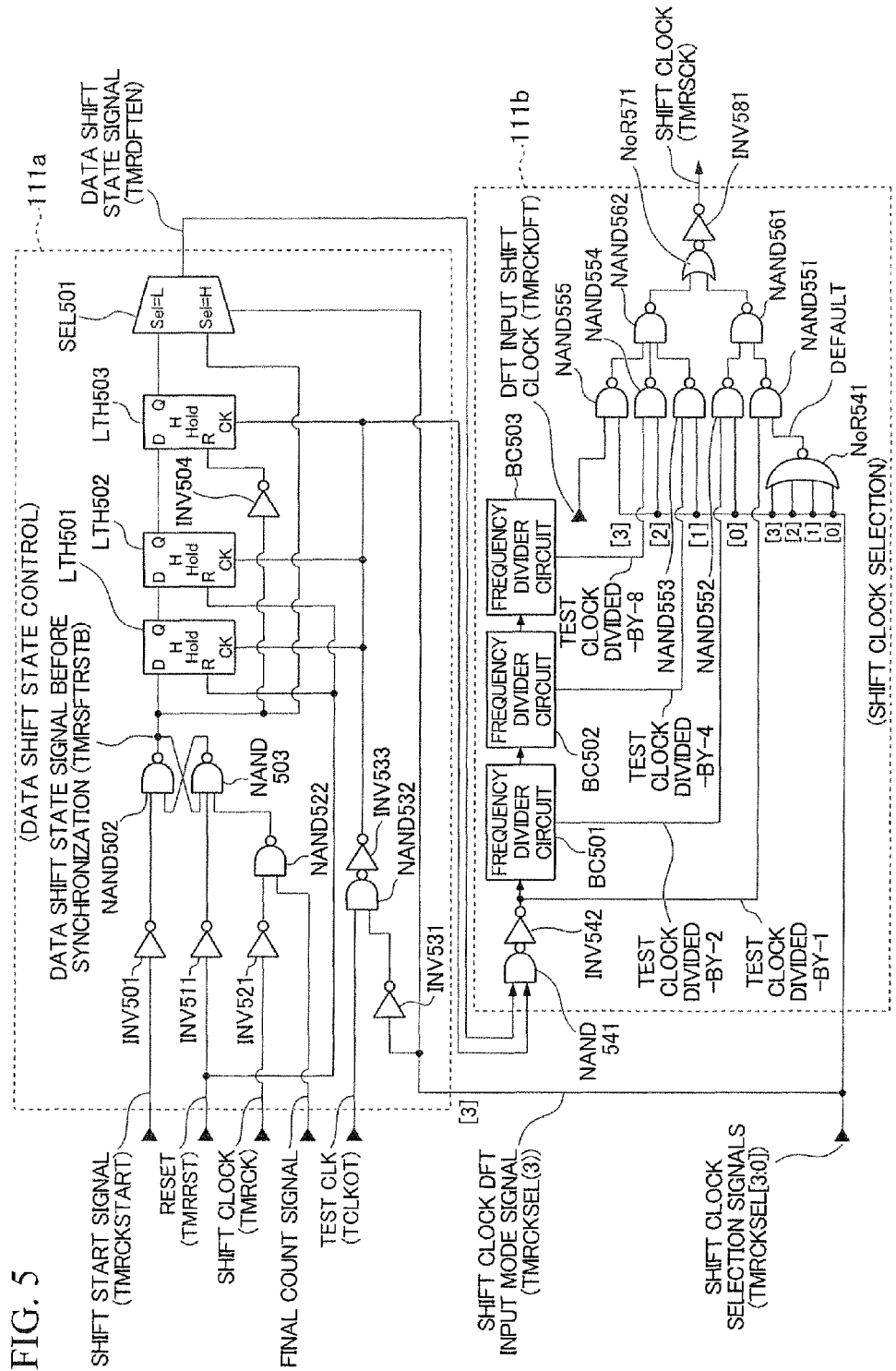
FIG. 5 is a circuit diagram of a shift clock control circuit included in the semiconductor device of FIG. 2.
Figure 6:
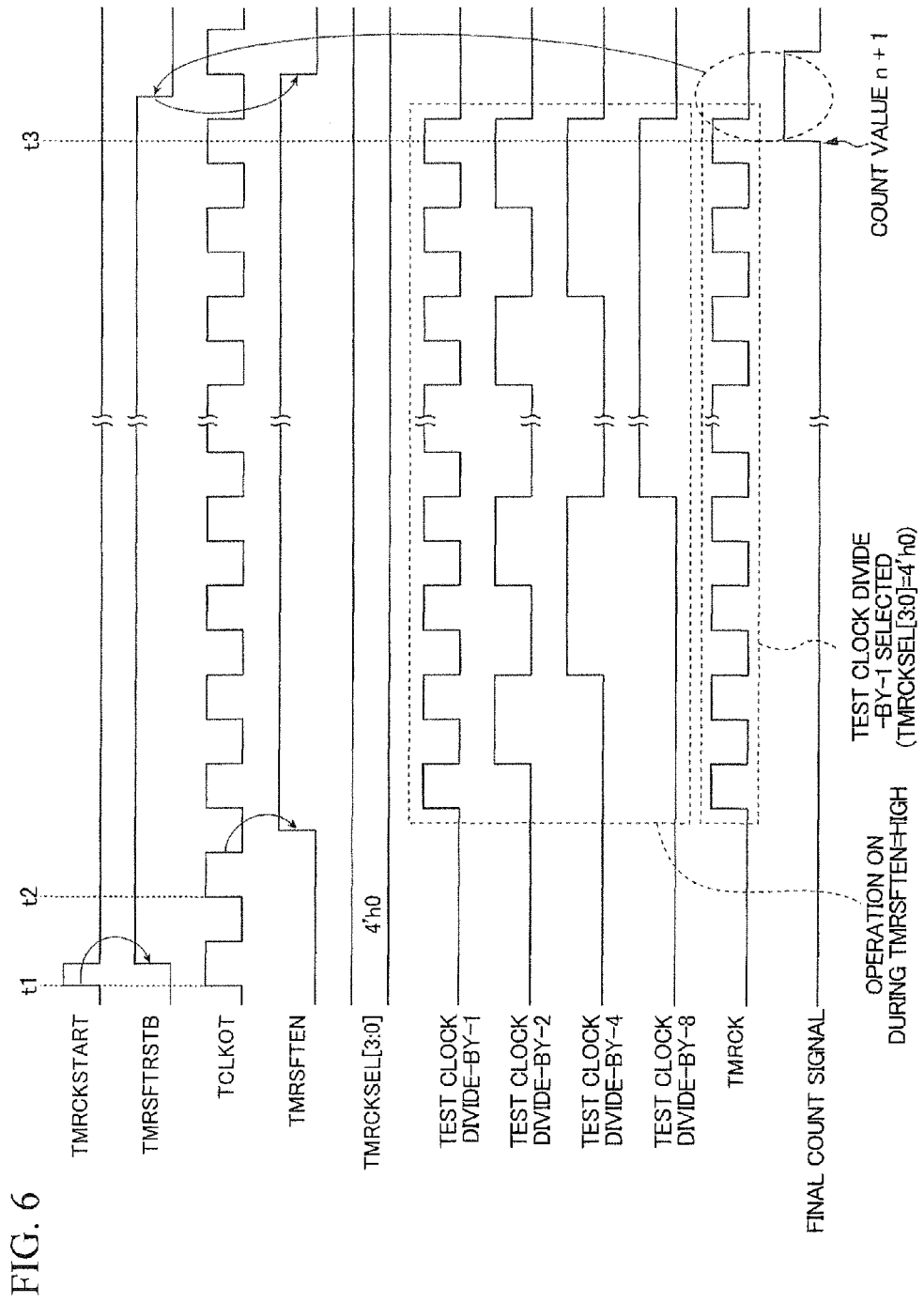
FIG. 6 is a timing chart of operations of the shift clock control circuit of FIG. 5.

FIG. 5 is a circuit diagram of the shift clock control circuit 111 shown in FIG. 2, and FIG. 6 is a timing diagram for describing the operation of the shift clock control circuit 111 shown in FIG. 5.

The shift clock control circuit 111 shown in FIG. 5 is constituted by a data shift state control unit 111a and a shift clock selecting unit 111b.

The data shift state control unit 111a is a circuit that generates a data shift state signal TMRSFTEN, which is a signal that establishes the data transfer time period in the register unit 109.

In the period of time during which the data shift state signal TMRSFTEN is at the active level (high level), the shift clock selecting unit 111b generates the shift clock TMRCK, and the 9-bit counter 112, to be described later, executes a count-up operation.

According to the logic level of the shift clock selecting signal TMRCKSEL [3:0], the shift clock selecting unit 111b selects one of a shift clock having the same period (divide-by-1) of the test clock TCLK0T, a shift clock having double the period (divide-by-2), a shift clock having four times the period (divide-by-4), a shift clock having eight times the period (divide-by-8), or a shift clock having an arbitrary period (DFT input shift clock), thereby generating the shift clock TMRCK.

The data shift state control unit 111a has an inverter circuit INV501, a NAND circuit NAND502, a NAND circuit NAND503, an inverter circuit INV504, an inverter circuit INV511, an inverter circuit INV521, a NAND circuit NAND522, an inverter circuit INV531, an inverter circuit INV532, and an inverter circuit INV533.

The data shift state control unit 111a also has a latch circuit LTH501, a latch circuit LTH502, a latch circuit LTH503, and a selector SEL501.

The inverter circuit INV501 logically inverts the shift state signal TMRCKSTART and outputs the result to one input of the two-input NAND circuit NAND502.

The shift start signal TMCKSTART is a signal generated by the decoder unit 106, using the test pre-address signal TPA.

The inverter circuit INV511 logically inverts the reset signal TMRRST and outputs the result to the second input of the three-input NAND circuit NAND 503.

The inverter circuit INV521 logically inverts the shift clock TMRCK and outputs the result to one input of the two-input NAND circuit NAND522.

The final count signal is input to the other input of the NAND circuit NAND522. The final count signal is a signal that changes to high level when the 9-bit counter 112, to be described later, outputs the shift data selection signal TCNT [8:0]=n+1. That is, it changes to high level after the shift clock TMRCK is generated n+1 times. For example, the decoder unit 106 compares the shift data selection signal TCNT with a pre-set final count value of n+1 and, when the two coincide, a high-level final count signal is output.

The output of the NAND circuit NAND522 is connected to the third input of the three-input NAND circuit NAND503.

The output of the NAND circuit NAND503 is connected to the other of the two inputs of the NAND circuit NAND502, and the output of the NAND circuit NAND502 is connected to the first input of the three-input NAND circuit NAND503. The NAND circuit NAND502 and the NAND circuit NAND503 constitute a set/reset flip-flop (hereinafter SRFF), the output of which outputs the SRFF signal TMRSFTRSTB before synchronization of the data shift state signal TMRSFTEN to the test clock TCLK0T.

The inverter circuit INV504 logically inverts the SRFF signal TMRSFTRSTB and outputs the result to the reset terminal R of the latch circuit LTH503.

The inverter circuit INV531 logically inverts the uppermost-order shift clock selection signal TMRCKSEL3 of the shift clock selection signal TMRCKSEL[3:0] and outputs the result to one of the two inputs of the NAND circuit NAND532.

The shift clock selection signal TMRCKSEL[3:0] is a signal that the decoder unit 106 generates, using the test pre-address signal TPA.

The other of the two inputs of the NAND circuit NAND532 has input to it the test clock TCLK0T. The test clock TCLK0T is a clock that is generated by the decoder unit 106, using the test pre-address signal TPA based on the external clock CK.

The inverter circuit INV533 logically inverts the output of the NAND circuit NAND532, and outputs the result to the clock terminal CLK of the latch circuit LTH501, the latch circuit LTH502, and the latch circuit LTH503, and to one of the two inputs of the NAND circuit NAND541 in the shift clock selecting unit 111b.

The data input terminal D of the latch circuit LTH501 is connected to the SRFF output and the latch circuit LTH501 latches the SRFF signal TMRSFTRSTB, the latched data being output at the data output terminal Q when the clock input to the clock terminal CLK changes from high level to low level.

The data input terminal D of the latch circuit LTH502 is connected to the data output terminal Q of the latch circuit LTH501, and the latch circuit LTH502 latches the output of the latch circuit LTH501, the latched data being output to the data output terminal Q when the clock input to the clock terminal CLK changes from high level to low level.

The data input terminal D of the latch circuit LTH503 is connected to the data output terminal Q of the latch circuit LTH502, and the latch circuit LTH503 latches the output of the latch circuit LTH502, the latched data being output at the data output terminal Q when the clock input at the clock terminal CLK changes from high level to low level.

The selector SEL501 outputs as the data shift state signal to the shift lock selecting unit 111b, the latch circuit LTH503 output when the shift clock selection signal TMRCKSEL3 is at the low level, and the SRFF signal TMRSFTRSTB when the shift clock selection signal TMRCKSEL3 is at the high level.

In this manner, the switching of the selector by the logic of the shift clock selection signal TMRCKSEL3 is done so that, as will be described later, when the shift clock selection signal TMRCKSEL3 is at the high level, the shift clock TMRCK is generated by the DFT input shift clock, so that the operating margin to stabilize the outputs of the frequency-dividing circuits is unnecessary, as is a period of time with a test clock TLCK0T synchronization up until the activation of the data shift state signal.

When the shift clock selection signal TMRCKSEL3 is a the high level, even if the test clock TLCK0T is supplied, because the output of the inverter circuit INV533 is at the low level, so that the output of the inverter circuit INV542 is also at the low level, frequency-dividing operations are not executed by the frequency-dividing circuits BC501 to BC503.

By the above-described constitution, the data shift state control unit 111a makes the SRFF signal TMRSFTRSTB high level when the shift start signal TMRCKSTART changes to the active level (high level). One of the terminals of the selector SEL501 changes to the high level at the second falling edge of the test clock TCLK0T, and when the shift clock selection signal TMRCKSEL3 is at the low level, a high-level data shift state signal TMRSFTEN is output from the selector SEL501. When the shift clock selection signal TMRCKSEL3 is at the high level, regardless of the input of the test clock TCLK0T, the SRFF signal TMRSFTRSTB is output as a high-level data shift state signal TMRSFTEN from the selector SEL501.

When the final count signal is input, the SRFF is reset, and the SRFF signal TMRSFTRSTB is made low level. Then, when the shift clock selection signal TMRCKSEL3 is at the low level, the latch circuit LTH503 is reset to the low level, the selector SEL501 selects the output of the latch circuit LTH503, and the data shift state signal TMRSFTEN is made the inactive level (low level). When the shift clock selection signal TMRCKSEL3 is at the high level, the selector SEL501 selects the SRFF signal TMRSFTRSTB, and the data shift state signal TMRSFTEN is made the inactive level (low level).

The shift clock selecting unit 111b is constituted by a NAND circuit NAND541, an inverter circuit INV542, a NOR circuit NOR541, a NAND circuit NAND551, a NAND circuit NAND552, a NAND circuit NAND553, a NAND circuit NAND554, a NAND circuit NAND555, a NAND circuit NAND561, a NAND circuit NAND562, a NOR circuit NOR571, and an inverter circuit INV581.

The data shift state signal TMRSFTEN is input to one input of the NAND circuit NAND541, and the output of the inverter circuit INV533 is input to the other input thereof.

The inverter circuit INV542 logically inverts the output of the NAND circuit NAND541 and outputs a signal with the same period as the test clock TLCK0T (divide-by-1 test clock) to the input of the frequency-dividing circuit BC501 and to one of the inputs to the NAND circuit NAND551. The other input of the NAND circuit NAND551 is connected to the output of the NOR circuit NOR541.

The NOR circuit NOR541 is a four-input negated logical summing circuit, as four inputs, the shift clock selection signal TMRCKSEL0 being input to the first input thereof, the shift clock selection signal TMRCKSEL1 being input to the second input thereof, the shift clock selection signal TMRCKSEL2 being input to the third input thereof, and the shift clock selection signal TMRCKSEL3 being input to the fourth input thereof.

The frequency-dividing circuit BC501 divides the divide-by-1 test clock input from the inverter circuit INV542 to obtain a signal having two-times the period of the test clock TCLK0T (this being a divide-by-2 test clock), which is output to the input of the frequency-dividing circuit BC502 and to one input of the NAND circuit NAND552. The shift clock selection signal TMRCKSEL0 is input to the other input of the NAND circuit NAND552.

One input of the NAND circuit NAND561 is connected to the output of the NAND circuit NAND551, the other input thereof is connected to the output of the NAND circuit NAND552, the output thereof is connected to one input f the NOR circuit NOR571.

The frequency-dividing circuit BC502 divides the divide-by-2 test clock input from the frequency-dividing circuit BC501 to obtain a signal having four times the period of a test clock TCLK0T (this being a divide-by-4 test clock), which is output to the output of the frequency-dividing circuit BC503 and to one input of the NAND circuit NAND553. The shift clock selection signal TMRCKSEL1 is input to the other input of the NAND circuit NAND553.

The frequency-dividing circuit BC503 divides the divide-by-4 test clock input from the frequency-dividing circuit BC502 to obtain a signal having a period that is eight times that of the test clock TCLK0T (this being a divide-by-8 test clock), which is output to the one input of the NAND circuit NAND554. The shift clock selection signal TMRCKSEL2 is input to the other input of the NAND circuit NAND554.

The DFT input shift clock is input to one input of the NAND circuit NAND555, and the shift clock selection signal TMRCKSEL3 is input to the other input thereof.

The DFT input shift clock is a signal that is generated by the decoder unit 106, using the test pre-address signal TPA.

The first input of the NAND circuit NAND562 is connected to the output of the NAND circuit NAND553, the second input thereof is connected to the output of the NAND circuit NAND554, the third input thereof is connected to the output of the NAND circuit NAND555, and the output thereof is connected to the other input of the NOR circuit NOR571.

The input of the inverter circuit INV581 is connected to the output of the NOR circuit NOR571, which is logically inverted by the inverter circuit INV581, which outputs the result as the shift clock TMRCK.

By the above-noted constitution, the shift clock selecting unit 111b, in accordance with the logic level of the shift clock selection signals TMRCKSEL[3:0], selects either a shift clock having the same period (one cycle) as the test clock TLCK0T (divide-by-1 test clock), a shift clock with two times the period (divide-by-2 test clock), a shift clock with four times the period (divided-by-4 test clock), and a shift clock with eight times the period (divide-by-8 test clock) or a shift clock of an arbitrary period (DFT input shift clock), and generates the shift clock TMRCK.

Specifically, when all of the shift clock selection signals TMRCKSEL[3:0] are at the low level, the shift clock selecting unit 111b selects the divide-by-1 test clock and generates the shift clock TMRCK.

When the shift clock selection signal TMRCKSEL0 is at the high level and all the other shift clock selection signals TMRCKSEL[3:1] are at the low level, the shift clock selecting unit 111b selects the divide-by-2 test clock and generates the shift clock TMRCK.

When the shift clock selection signal TMRCKSEL1 is at the high level and the other shift clock selection signals TMRCKSEL[3:2] and the shift clock selection signal TMRCKSEL0 are all at the low level, the shift clock selecting unit 111b selects the divide-by-4 test clock and generates the shift clock TMRCK.

When the shift clock selection signal TMRCKSEL2 is at the high level and the other shift clock selection signal TMRCKSEL3 and all the other shift clock selection signals TMRCKSEL[1:0] are at the low level, the shift clock selecting unit 111b selects the divide-by-8 test clock and generates the shift clock TMRCK.

When the shift clock selection signal TMRCKSEL3 is at the high level and all the other shift clock selection signals TMRCKSEL[2:0] are at the low level, the shift clock selecting unit 111b selects the DFT input shift clock and generates the shift clock TMRCK.

The setting of the logic levels of the shift clock selecting signals [3:0] is described later.

FIG. 6 is a timing diagram used for describing the operation of the shift clock controlling unit 111. FIG. 6 shows the operation in the case in which all of the shift clock selection signals TMRCKSEL[3:0] are at the low level (TMRCKSEL [3:0]=4'h0). In this case, because the level of the above-noted NOR circuit NOR541 is the high level, the NAND circuit NAND551 operates and the NAND circuits NAND552 to NAND555 do not operate, so that the shift clock control circuit 111 generates a shift clock TMRCK having the same period (one cycle) as the test clock TCLK0T.

At time t1, when the shift start signal TMRCKSTART changes to the active level (high level), the SRFF makes the SRFF signal TMRSFTRSTB the active level (high level). The latch circuit LTH501 captures the SRFF signal TMRSFTSTB during the period in which the test clock TLCK0T is at the high level, and makes the data output terminal Q high level when the test clock TCLK0T changes to the low level.

During the period in which the test clock TCLK0T is at the low level, the latch circuit LTH502 captures the output (high level) of the latch circuit LTH501 and, when the test clock TCLK0T changes to the high level, makes the data output terminal Q high level.

At time t2, when the test clock TCLK0T changes to the high level, the latch circuit LTH503, during the period in which the test clock TCLK0T is at the high level, captures the output (high level) of the latch circuit LTH502 and, when the test clock TCLK0T changes to the low level, makes the data output terminal Q high level. Because the shift clock selection signal TMRCKSEL3 is at the low level, the selector SEL501 selects the output of the latch circuit LTH503, and makes the data shift state signal TMRSFTEN the active level (high level).

The shift clock selecting unit 111b selects the divide-by-1 test clock and, until time t3, generates a shift clock TMRCK having the same period as the test clock TCLK0T.

At time t3, when the shift data selection signal TCNT reaches the final count value n+1, the high-level final count signal is input to the other input of the NAND circuit NAND522. When the shift clock TMRCK changes to the low level, a high-level signal from the inverter circuit INV521 is input to one of the inputs of the NAND circuit NAND522, and the NAND circuit NAND522 makes its output low level. The result is that the output of the NAND circuit NAND503 changes to the high level. Because the output of the inverter circuit INV501 is at the high level, the SRFF is reset, and the SRFF makes the SRFF signal TMRSFTRSTB low level (inactive level). The result is that the inverter circuit INV504 outputs a high-level signal to the R terminal of the latch circuit LTH503, and the latch circuit LTH503 makes its data output terminal Q low level. The selector SEL501 makes the data shift state signal TMRSFTEN low level (inactive level).

Next, the 9-bit counter 112 and the selector 113 will be described, with references made to FIG. 7 and FIG. 8.

Figure 7:
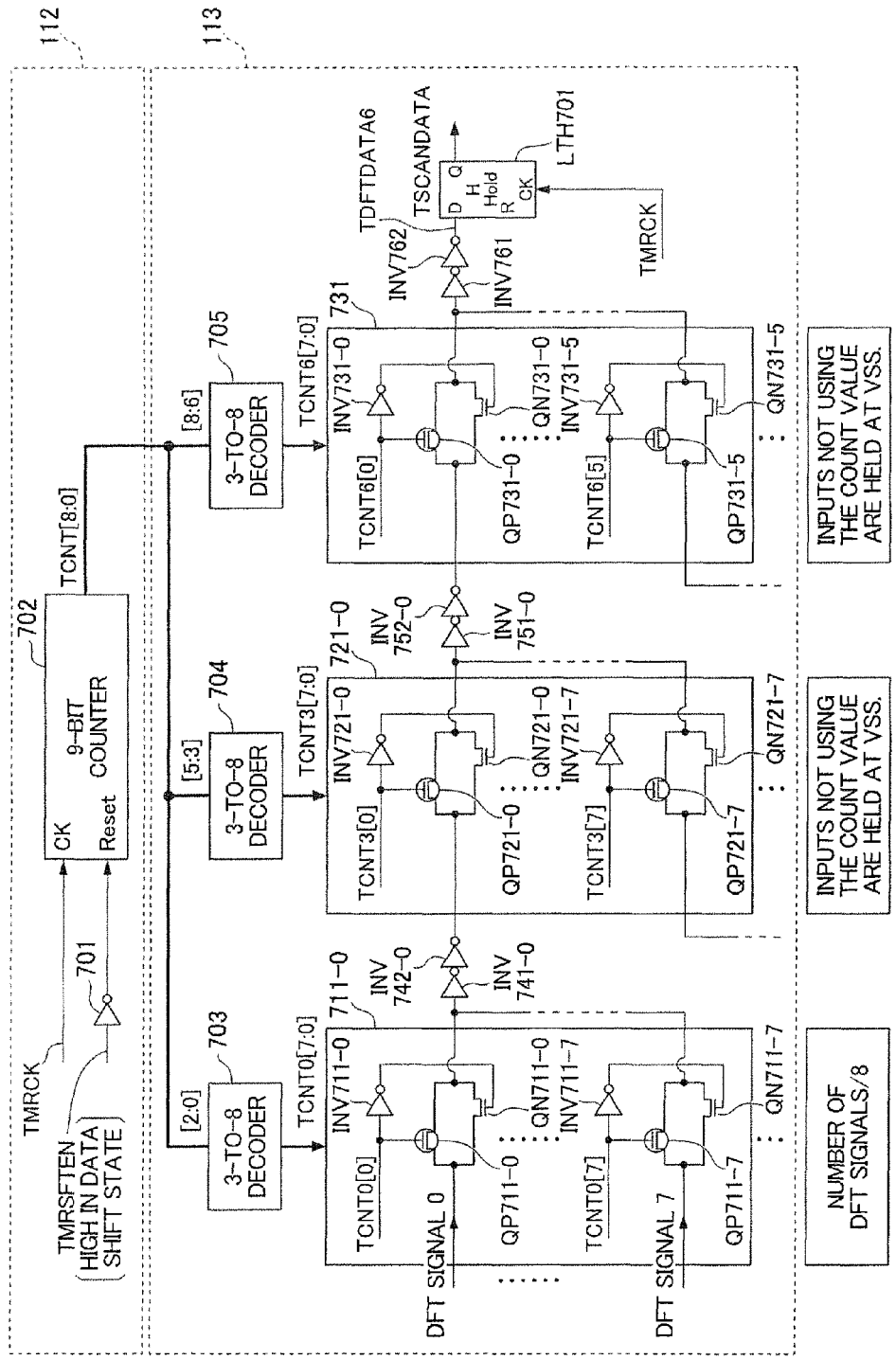
FIG. 7 is a circuit diagram of a 9-bit counter and a selector included in the semiconductor device of FIG. 2.

FIG. 7 is a circuit diagram of the 9-bit counter 112 and the selector 113. FIG. 8 is a timing diagram for describing the operation of the 9-bit counter 112 and the selector 113.

As shown in FIG. 7, the 9-bit counter 112 is constituted by an inverter circuit INV701 and a 9-bit counter 702.

The 9-bit counter 702 is a counter to the clock input terminal CK of which the shift clock TMRCK is input, and which performs a counting up operation in synchronization with the rising edge of the shift clock TMRCK, a 9-bit shift data selection signal TCNT[8:0] being output from the output terminals thereof.

The inverter circuit INV701 logically inverts the data shift state signal TMRSFTEN and outputs the result to the reset terminal Reset of the 9-bit counter 702.

During the period in which the data shift state signal TMRSFTEN output by the shift clock control circuit 111 is at the active level (high level), the 9-bit counter 112 counts up the shift data selection signals TCNT[8:0] from 0. When the shift data selection signals TCNT[8:0] reach n+1, the data shift state signal TMRSDTEN output by the shift control circuit 111 changes to the low level, and the 9-bit counter 112 stops the counting operation and makes the shift data selection signals TCNT[8:0] 0.

The selector 113 is constituted by decoders 703 to 705 (count decoders), first test signal switching units 711-0 to 711-37, inverter circuits INV741-0 to INV741-37, inverter circuits INV742-0 to INV71-37, second test signal switching units 721-0 to 721-4, inverter circuits INV751-0 to INV751-4, inverter circuits INV752-0 to INV752-4, a third test signal switching unit 731, an inverter circuit INV761, an inverter circuit 762, and a latch circuit LTH701.

The decoder 703 is a three-input, eight-output decoder circuit, which decodes the three bits of the shift data selection signals TNCT[2:0] of the shift data selection signals TCNT[8:0] and generates decode signals TCNT0[7:0].

When the shift data selection signals TCNT[2:0]=0. the decoder 703 makes the decode signal TCNT0[0] low level, and makes all the other decode signals TCNT0[7:1] high level.

When the shift data selection signals TCNT[2:0]=1, the decode signal TCNT0[1] is made low level and all the other decode signals TCNT0[7:2] and TCNT[0] are made high level.

When the shift data selection signals TCNT[2:0]=2, the decode signal TCNT0[2] is made low level and all the other decode signals TCNT0[7:3] and TCNT0[1:0] are made high level.

When the shift data selection signals TCNT[2:0]=3, the decode signal TCNT0[3] is made low level, and all the other decode signals TNT0[7:4] and TCNT0[2:0] are made high level.

When the shift data selection signals TCNT[2:0]=4, the decode signal TCNT0[4] is made low level, and all the other decode signals TCNT0[7:5] and TCNT0[3:0] are made high level.

When the shift data selection signals TCNT[2:0]=5, the decode signal TCNT0[5] is made low level, and all other decode signals TCNT0[7:6] and TCNT0[4:0] are made high level.

When the shift data selection signals TCNT[2:0]=6, the decode signal TCNT0[6] is made low level, and all the other decode signals TCNT0[7] and TCNT0[5:0] are made high level.

When the shift data selection signals TCNT[2:0]=7, the decode signal TCNT0[7] is made low level, and all the other decode signals TCNT0[6:0] are made high level.

In this manner, if the value of the input three-bit shift data selection signal TCNT[2:0] is i ($0 \leq i \leq 7$), the decoder 703 makes the decode signal TCNT0[$i$] low level and makes the other decode signals TCNT3 all high level.

The decoder 704 is a three-input, eight-output decoder circuit, which decodes the three bits of the shift data selection signals TNCT[5:3] of the shift data selection signals TCNT [8:0] and generates the decode signals TCNT3[7:0].

If the value of the input three bits of shift data selection signals TCNT[5:3] is j ($0 \leq j \leq 7$), the decoder 704, similar to the decoder 703, makes the decode signal TCNT3[$j$] low level, and makes the other decode signals TCNT3 all high level.

The decoder 705 is a three-input, eight-output decoder circuit, which decodes the three bits of the shift data selection signals TCNT[8:6] of the shift data selection signals TCNT [8:0], and generates the decode signals TCNT6[7:0].

If the value of the input three bits of shift data selection signals TCNT[8:6] is k ($0 \leq k \leq 7$), the decoder 705, similar to the decoders 703 and 704, makes the decode signal TCNT6[$k$] low level, and makes the other decode signals TCNT6 all high level.

If, as shown in FIG. 5, one sub-signal switching unit S711-0 is constituted by an inverter circuit INV711-0, a p-channel MOS transistor QP711-0, and an n-channel MOS transistor QN711-0, the first test signal switching unit 711-0 is constituted by eight sub-signal switching units S711-0 to S711-7. In the sub-signal switching unit S711-0, the source of the p-channel MOS transistor QP711-0 and the drain of the n-channel MOS transistor QN711-0 are connected in common, and a test signal DFTIN0 (shown as the DFT signal 0 in FIG. 7) is input to the commonly connected node. The drain of the p-channel MOS transistor QP711-0 and the source of the n-channel MOS transistor QN711-0 are connected in common, and are connected to the input of the inverter circuit INV741-0. The decode signal TCNT0[0] from the decoder 703 is input to the gate of the p-channel MOS transistor QP711-0, and a signal that is the decode signal TCNT0[0] logically inverted by the inverter circuit INV711-0 is input to the gate of the n-channel MOS transistor QN711-0.

The other sub-signal switching units S711-1 to S711-7 are constituted in the same manner as the sub-signal switching unit S711-0. The constitution is such that the test signal DFTIN$i$ is input to the sub-signal switching unit S711-$i$ ($0 \leq i \leq 7$), this being selected by the decode signal TCNT0[$i$], and transferred to the inverter circuit INV741-0.

The first test signal switching units 711-1 to 711-37, in the same manner as the first test signal switching unit 711-0, are each constituted by eight sub-signal switching units S711-$i$ ($0 \leq i \leq 7$).

That is, each of the first test signal switching units 711-$p$ ($0 \leq p \leq n/8$) has sub-signal switching units S711-$i$ ($0 \leq i \leq 7$) to which the test signal DFTIN (p×8+i) is input, the sub-signal switching unit S711-$i$ selecting the test signal DFTIN(p×8+i) by the decode signal TCNT0[$i$], and transferring it to the inverter circuit INV741-$p$.

If, as shown in FIG. 5, one sub-signal switching unit S721-0 is constituted by an inverter circuit INV721-0, a p-channel MOS transistor QP721-0, and an n-channel MOS transistor QN721-0, the second test signal switching unit 721-0 is constituted by eight sub-signal switching units S721-0 to S721-7. In the sub-signal switching unit S721-0 the source of the p-channel MOS transistor QP721-0 and the drain of the n-channel MOS transistor QN721-0 are connected in common, and the output of the inverter circuit INV742-0 is input to the commonly connected node. The drain of the p-channel MOS transistor QP721-0 and the source of the n-channel MOS transistor QN721-0 are connected in common and connected to the input of the inverter circuit INV751-0. The decode signal TCNT3[0] from the decoder 704 is input to the gate of the p-channel MOS transistor QP721-0, and a signal that is the decode signal TCNT3[0] logically inverted by the inverter circuit INV721-0 is input to the gate of the n-channel MOS transistor QN721-0.

The other sub-signal switching units S721-1 to S721-7 are constituted in the same manner as the sub-signal switching unit S721-0. The constitution is such that the output of the inverter circuit INV742-$j$ is input to the sub-signal switching unit S721-$j$ ($0 \le j \le 7$), this being selected by the decode signal TCNT3[$j$] and transferred to the inverter circuit INV751-0.

That is, each of the second test signal switching units 721-0 to 721-4, similar to the first test signal switching units 711-0 to 711-37, has sub-signal switching units S721-$j$ ($0 \le j \le 7$).

Each of the second test signal switching units 721-$q$ ($0 \le q \le 3$) has sub-signal switching units S721-$j$ ($0 \le j \le 7$), to the inputs of which are input the outputs of the inverter circuits INV742-($q \times 8+j$), the sub-signal switching units S721-$j$ selecting the outputs of the inverter circuits INV742-($q \times 8+j$) by the decode signal TCNT3[$j$], and transferring them to the inverter circuits INV751-$q$.

The second test signal switching unit 721-$q$ (q=4) has sub-signal switching units S721-$j$ ($0 \le j \le 5$) to which are input the outputs of the inverter circuits INV742-($q \times 8+j$), and sub-signal switching units S721-$j$ ($6 \le j \le 7$), the inputs of which are connected to the ground power supply voltage VSS, thereby inputting the ground potential, and a sub-signal switching unit S721-$j$ selects either the output of the inverter circuit INV742-($q \times 8+j$) or the ground potential by the decode signal TCNT3[$j$], and transfers it to the inverter circuit INV751-$q$.

If, as shown in FIG. 5, one sub-signal switching unit S731-0 is constituted by an inverter circuit IN731-0, a p-channel MOS transistor QP731-0, and an n-channel MOS transistor QN731-0, the third test signal switching unit 731-0 is constituted by eight sub-signal switching units S731-0 to S731-7. In the sub-signal switching unit S721-0 the source of the p-channel MOS transistor QP731-0 and the drain of the n-channel MOS transistor QN731-0 are connected in common, and the output of the inverter circuit INV752-0 is input to the commonly connected node. The drain of the p-channel MOS transistor QP731-0 and the source of the n-channel MOS transistor QN731-0 are connected in common and connected to the input of the inverter circuit INV761. The decode signal TCNT6[0] from the decoder 705 is input to the gate of the p-channel MOS transistor QP731-0, and a signal that is the decode signal TCNT6[0] logically inverted by the inverter circuit INV731-0 is input to the gate of the n-channel MOS transistor QN731-0.

The other sub-signal switching units S731-1 to S731-7 are constituted in the same manner as the sub-signal switching unit S731-0. The constitution is such that the output of the inverter circuit INV742-$k$ is input to the sub-signal switching unit S731-$k$ ($0 \le k \le 7$), this being selected by the decode signal TCNT6[$k$] and transferred to the inverter circuit INV761.

That is, the third test signal switching unit 731, similar to the first test signal switching units 711-0 to 711-37 and the second test signal switching units 721-0 to 721-4, has sub-signal switching units S731-$k$ ($0 \le k \le 7$).

The third test signal switching unit 731 has sub-signal switching units S731-$k$ ($0 \le k \le 4$) to which are input the outputs of the inverter circuits INV752-$k$, and sub-signal switching units S731-$k$ ($5 \le k \le 7$), the inputs of which are connected to the ground power supply voltage VSS, thereby inputting the ground potential, and a sub-signal switching unit S731-$k$ selects either the output of the inverter circuit INV752-$k$ or the ground potential by the decode signal TCNT[6], and transfers it to the inverter circuit INV761.

By the above-noted constitution, the first test signal switching unit to the third test signal switching unit, by the decode signal TCNT0[$i$], the decode signal TCNT3[$j$], and the decode signal TCNT6[$k$], which is the result of the decoders 703 to 705 decoding the shift data selection signals TCNT[$i+j \times 8+k \times 64$], select one of the test signals DFTIN($i+j \times 8+k \times 64$), and transfer it to the inverter circuit INV761. The inverter circuit INV762 logically inverts the output of the inverter circuit INV761 outputs the final selection signal TDFTDATA6 to the latch circuit LTH701.

The latch circuit LTH701 has its data input terminal D connected to the output of the inverter circuit INV762 and latches the final selection signal TDFTDATA6 and, when the clock input at the clock terminal CLK thereof changes from the high level to the low level, outputs the shift data TSCANDATA from the data output terminal Q.

In order to select 510 (the maximum count value of the 9-bit counter−1) test signals DFTIN, a total of $8^3+8^2+8^1$ sub-signal switching units, in addition to $(8^3+8^2+8^1) \times 2=146$ inverter circuits for data transfer are used. To select one test signal DFTIN, therefore, it is sufficient to have approximately 1.2 p-channel MOS transistors, 1.2 n-channel MOS transistors, and 1.4 inverter circuits. In contrast, in the case of adopting a constitution in which all the of the DFT decoder 202 outputs are first latched into DFT registers (in the case, for example, of the constitution shown in FIG. 15), the DFT registers shown in FIG. 3B are required, and to select one test signal DFTIN, a large number of MOS transistors and logic circuits are required. That is, according to the present invention, by using the above-described selector, it is possible to reduce the number of elements, thereby enabling a reduction in the scale of the test circuit, and suppression in the increase in the chip size of the semiconductor device.

FIG. 8 is a timing diagram showing the operation of the 9-bit counter 112 and the selector 113.

At time t1, when the shift clock control circuit 111 makes the data shift state signal TMRSFTEN the active level (high level), the 9-bit counter 112 outputs the initial value shift data selection signals TCNT[8:0]=0, the decoders 703 to 705 respectively output a low-level decode signal TCNT0[0], a low-level decode signal TCNT3[0], and a low-level decode signal TCNT6[0], and the first test signal switching unit to the third test signal switching unit transfer the test signal DFTIN0 (shown as DFT0 in FIG. 8). The selector 113 makes the final selection signal TDFTDATA6 the same level as the test signal DFTIN0, and outputs it from the latch circuit LTH701 as the shift data TSCANDATA.

After that, when the shift clock changes to the high level, the 9-bit counter 112 starts the counting up operation, and outputs the shift data selection signals TCNT[8:0]=1. The decoders 703 to 705 each output respectively a low-level decode signal TCNT0[1], a low-level decode signal TCNT3[0], and a low-level decode signal TCNT6[0], and the first test signal switching unit to the third test signal switching unit transfer the test signal DFTIN1 (shown as DFT1 in FIG. 8). The selector 113 makes the final selection signal TDFTDATA6 the same level as the test signal DFTIN1, and when the shift clock changes from high level to low level at time t2, outputs the test signal DFTIN1 from the latch circuit LTH701 as the shift data TSCANDATA.

After that, when the shift clock changes to the high level, the 9-bit counter 112 outputs the shift data selection signals TCNT[8:0]=2. The decoders 703 to 705 respectively output a low-level decode signal TCNT0[2], a low-level decode signal TCNT3[0], and a low-level decode signal TCNT6[0] and the first test signal switching unit to the third test signal switching unit transfer the test signal DFTIN2 (shown as DFT2 in FIG. 8). The selector 113 makes the final selection signal TDFT-DATA6 the same level as the test signal DFTIN2 and, when the shift clock changes from high level to low level at time t3, outputs the test signal DFTIN2 from the latch circuit LTH701 as the shift data TSCANDATA.

Thereafter, the 9-bit counter 112 executes a count up operation at the rising edge of the shift clock TMRCK, and increments the shift data selection signals TCNT[8:0] by one at a time.

The decoders 703 to 705, in response to the value of the shift data selection signals TCNT[8:0], set one of the decoder signals TCNT0[$i$] to the low level, one of the decoder signals TCNT3[$j$] to the low level, and one of the decoder signals TCNT6[0] to the low level, respectively.

The first test signal switching unit to the third test signal switching unit transfer one of the test signals DFTIN(i+j×8+k×64).

The selector 113 makes the final selection signal TDFT-DATA6 the same level as the test signal DFTIN(i+j×8+k×64) and, when the shift clock changes from high level to low level, outputs the test signal DFTIN (i+j×8+k×64) from the latch circuit LTH701 as the shift data TSCANDATA.

By the shift data selection signal TCNT[8:0]=n, the first test signal switching unit to the third test signal switching unit transfer the last test signal DFTINn (i=7, j=5, k=4).

When the shift clock changes from the high level to the low level at time t4, the selector 113 outputs the test signal DFTINn (indicated as DFTn in FIG. 8 from the latch circuit as the shift data TSCANDATA.

Next, when the shift data selection signals TCNT[8:0]=n+1, the second signal switching unit to the third test signal switching unit transfer the ground potential, to which the sub-signal switching unit S721-6 of the sub-signal switching units S721-$q$ (q=4) of the second test signal switching unit are connected.

The selector 113 outputs the low-level signal from the latch circuit LTH701 as the shift data TSCANDATA.

Because the shift data selection signals TCNT[8:0] has become n+1, at the count time t6, the shift clock control circuit 111 make the data shift state signal TMRSFTEN the inactive level (low level). By doing this, the 9-bit counter 112 is reset, and the shift data selection signals TCNT[8:0]=0 is output.

During the above-noted counting operation of the 9-bit counter 112, while the shift clock TMRCK is at the active level (high level), each of the plurality of DFT registers DFTri (0≤i≤n) captures the previous-stage register output signal TSFTi−1 at the internal node N304 and, when the shift clock TMRCK changes to the inactive level (low level), outputs the register output signal TSFTi.

Therefore, when the shift clock TMRCK is input to the register unit 109 (n+1) times, during the period in which the (n+1)th shift clock TMRCK is high level, the test signal DFTIN(n−i) output by the DFT decoder 202 is captured at the internal node N304 of each of the plurality of DFT registers DFTri that constitute the register unit 109. That is, before the shift clock TMRCK changes from high level to low level at time t5, each of the plurality of DFT registers DFTri captures the test signal DFTIN(n−i) at the internal node N304.

After the shift clock TMRCK is input (n+1) times, when the shift clock TMRCK changes to the low level (at time t5), each of the plurality of DFT registers DFTri outputs the test signal DFTIN(n−i) as the register output signal TSFTi.

(Test Mode Entry)

Of the operation of the semiconductor device 100, the operation related to test operation will now be described, with references made to the drawings. The entry operation of the test mode will be described first, using drawings.

Figures 9A, 9B:
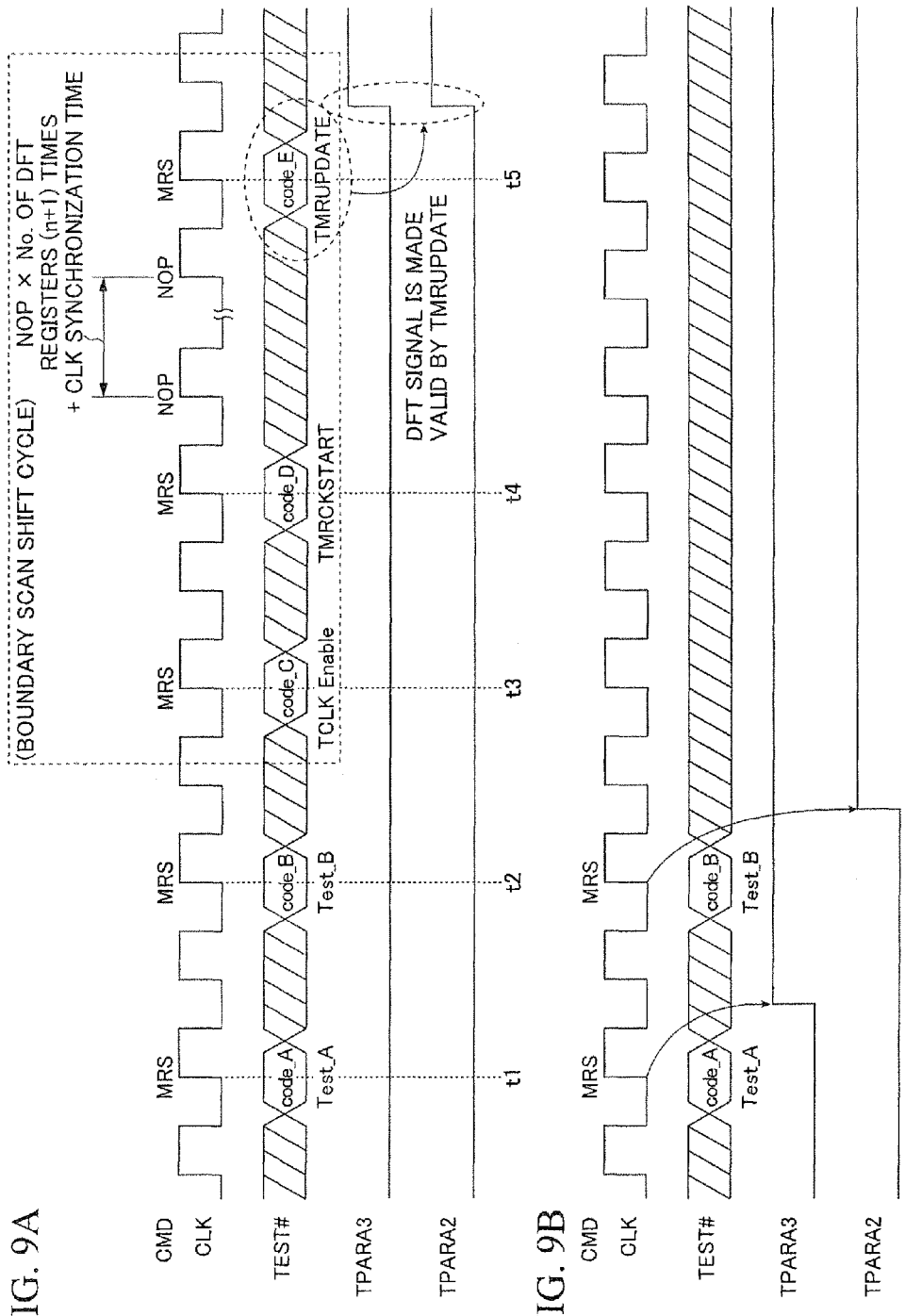
FIGS. 9A and 9B are timing charts of operations of semiconductor device of FIG. 2 to entry into a test mode.

FIG. 9 is a timing diagram showing, of the test operation of the semiconductor device, the operation of entry into the test mode. FIG. 9A shows the operation of test mode entry in the semiconductor device 100, and FIG. 9B shows the operation of test mode entry in the semiconductor device 900 shown in FIG. 13.

In FIG. 9A shows the operation in which the semiconductor device, in synchronization with the clock signal CK input from outside and the inverted clock signal/CK, which is a complementary signal of the clock signal CK (both of these being referred to collectively hereinafter as the external clock), captures a test command signal (MRS) and test code signals (address code_A, code_B, code_C, code_D, code_E). By capturing the test command and the test code signals in this sequence, in the semiconductor device 100, of the test signals DFTIN0 to DFTINn, which are output signals of the decoder unit 106, the test signals TPARA3 and TPARA2 are transferred to the corresponding DFT registers. After completion of the transfer, each of the plurality of DFT registers DFTri (0≤i≤n) outputs to the corresponding control circuit CKT(n−i) at test control signal DFT(n−i), thereby activating the control circuit CKT(n−i).

The control signals used in the description of the above-noted circuit constitution (shift start signal TMRCKSTART, test clock TCLK0T, and DFT generation signal TMRUP-DATE) are generated by the decoder unit 106, using the test code signal test pre-address signal TPA.

In particular, with regard to the test clock TCLK0T that is used in the shift clock control circuit 111, as one example, it is possible to adopt a constitution in which a clock generating circuit that generates the test clock TCLK0T synchronized to the external clock CLK is disposed within the decoder unit 106, this clock generating circuit generating the test clock TCLK0T based on the test code signal (address code_C). This clock generating circuit, in response to a test pre-address signal TPA generated one time based on the test command signal (MRS) and the test code signal (address code_C) generates a test clock TCLK0T that is synchronized to the external clock CLK, even if subsequently the test command signal and test code signal are not supplied from outside (even if the test command signal is a NOP and the test code signal is not supplied).

At time t5, the command decoder 102 captures the test command (MRS) and outputs to the address latch 105 a test command signal TRS synchronized to the internal clock signal. The address latch 105 latches the address signal (address code_A) input from outside, in synchronization with the test command signal TRS, and supplies the test address signal TA to the decoder unit 106. In the decoder unit 106, the address pre-decoder 201 supplies the test pre-address signal TPA to the DFT decoder 202, and the DFT decoder 202 of the decoder unit 106 makes the test signal TPARA3 of the test signals DFTIN0 to DFTINn high level.

At time t2, the command decoder 102 captures the test command (MRS) and outputs the test command signal TRS synchronized to the internal clock signal to the address latch 105. The address latch 105 latches the address signal (address code_B) input from outside, in synchronization with the test command signal TRS, and supplies the test address signal TA to the decoder unit 106. In the decoder unit 106, an address pre-decoder 201 supplies to the DFT decoder 202 test pre-address signal TPA, and the DFT decoder 202 of the decoder unit 106 makes the test signal TPARA2 of the test signals DFTIN0 to DFTINn high level.

At time t3, the command decoder 102 captures the test command (MRS) and outputs the test command signal TRS synchronized to the internal clock signal to the address latch 105. The address latch 105 latches the address signal (address code_C) input from outside, in synchronization with the test command signal TRS, and supplies the test address signal TA to the decoder unit 106. In the decoder unit 106, the clock generating circuit generates the test clock TCLK0T in synchronization with the external clock, and supplies it to the shift clock control circuit 111 (TCLK Enable).

Next, at time t4, the command decoder 102 captures the test command (MRS) and outputs the test command signal TRS synchronized to the internal clock signal to the address latch 105. The address latch 105 latches the address signal (address code_D) input from the outside, in synchronization with the test command signal TRS, and supplies the test address signal TA to the decoder unit 106.

The decoder unit 106 supplies an active-level (high-level) shift start signal (TMRCKSTART) to the shift clock control circuit 111.

The data shift state control unit 111a in the shift clock control circuit 111 makes the data shift state signal TMRSFTEN, which is a signal that establishes the data transfer time in the register unit 109, the active level (high level).

The shift clock selecting unit 111b in the shift clock control circuit 111 generates a shift clock TMRCK having the same period (one cycle) as the test clock TLCK0T.

Thereafter, between time t4 and time t5, the 9-bit counter 112 executes count-up operation in synchronization with the rising edge of the shift clock TMRCK, and increments the shift data selection signals TCNT[8:0] by one each time. The selector 113, in response to the value of the shift data selection signals TCNT[8:0], transfers one of the test signals DFTIN to the latch circuit LTH701 in the output section and, in synchronization with the falling edge of the shift clock TMRCK, outputs the test signal DFTIN from the latch circuit LTH701, as the shift data TSCANDTA to the register unit 109.

Each of the DFT registers of the register unit 109 captures the shift data TSCANDATA (test signal DFTIN) transferred from the selector 113 at the rising edge of the shift clock TMRCK, and outputs it to the next DFT register stage at the falling edge of the shift clock TMRCK.

When the shift data selection signals TCNT[8:0] output by the 9-bit counter 112 reach n+1, the decoder unit 106 outputs the final count signal, and the data shift state control unit 111a in the shift clock control circuit 111 makes the data shift state signal TMRSFTEN the inactive level (low level). By doing this, the 9-bit counter 112 stops the count-up operation. In the register unit 109, by the falling edge of the (n+1)th shift clock TMRCK, the internal node N304 and register output signal TSFT of each DFT register become the same logic level as the corresponding test signal DFTIN. The test signal TPARA2 and the test signal TPARA3 are also transferred to the corresponding DFT register internal node N304 and register output terminal (terminal that outputs the register output signal TSFT).

At time t5, the command decoder 102 captures the test command (MRS) and outputs the test command TRS to the address latch 105, in synchronization with the internal clock signal. The address latch 105 latches address signal (address code_E) input from outside in synchronization with the test command TRS, and supplies the test address TA to the decoder unit 106.

The decoder unit 106 supplies an active-level (high-level) DFT generation signal TMRUPDATE to each of the DFT registers of the register unit 109. In each of the DFT registers, TG3 is turned on, and each of the DFT registers outputs the test signals DFTIN (test signal TPARA2 and test signal TPARA3) output by the DFT decoder 202 and finally captured in the transfer operation to the corresponding control circuit CKT as the test control signals (test signals in the drawing).

In this manner, the semiconductor device (semiconductor device 100) of the present invention is a semiconductor device having a decoder (decoder unit 106) that decodes test information (address code_A, code_B: test code signals) supplied from outside the semiconductor device and generates a plurality of signals (test signals DFTIN0 to DFTINn), a plurality of registers (register unit 109 constituted by the DFT registers DFTr0 to DFTrn) that are mutually cascade-connected, a plurality of control circuits corresponding to the plurality of registers (control circuits CKT0 to CKTn), a selector (selector 113) that supplies the plurality of signals to a first register (DFT register DFTr0) of the plurality of registers, a counter (9-bit counter 112) that establishes the number of selecting of the selector, and a shift clock generating circuit (shift clock control circuit 111) that supplies to the plurality of registers and the counter a number of clock cycles corresponding to the number of the plurality of control circuits.

The semiconductor device 900 has a constitution in which signal interconnects for supplying test signals to each control circuit are provided, wherein, as shown in FIG. 9B, a test command signal (MRS) and test code signals (address code_A, code_B) are sequentially captured and the decoder 106, based on the test codes, supplies DFT signals to the control circuit by the dedicated interconnects.

In contrast, in the present invention, when a plurality of test signals generated by the decoder are transferred to each of a plurality of registers that are mutually cascade-connected, by the shift data selection signals TCNT[8:0], which are the result of the counting of the shift clock TMRCK by the 9-bit counter 112, the selector 113 sequentially selects one of the plurality of test signals DFTIN and supplies the test signal to the first DFT register DFTr0 of the plurality of registers. That is, number of selectings of the selector 113 is established by the counter 112, and the selector supplies all of the plurality of test signals DFTIN to a first register of the plurality of registers. The shift clock control circuit supplies as many shift clocks TMRCK to each of the plurality of registers as there are control circuits. Each time each of the plurality of DFT registers DFTri (0≤i≤n) which is supplied with the shift clock TMRCK is supplied with the shift clock TMRCK, the plurality of test signals DFTNi supplied from the selector 113 is sequentially transferred, and when the shift clocks TMRCK that is the number of control circuits CKTi has been supplied, the test signal DFTIN(n−i) that activates the control circuit CKT(n−i) connected to it is received.

By doing this, individual interconnects for transferring to the control circuits the plurality of test signals DFTINi, which are output from the DFT decoder 202 are not necessary and, compared with the semiconductor device 900, it is possible to suppress an increase in the chip size in the semiconductor device. Also, in contrast to a semiconductor device in which a first register unit is provided that individually receives the plurality of test signals DFTINi from a DFT decoder circuit, with the present invention this first register unit is not required. Compared with the number of elements in the plurality of master-slave flip-flops constituting the first register unit, because number of elements required for the selector 113 is smaller, compared to a semiconductor device that is provided with a first register unit that individually receives the plurality of test signals from the decoder circuit, it is possible to reduce the scale of the test circuit and to suppress an increase in the chip size in the semiconductor device.
(DFT Monitor Mode)

Next, the DFT monitor mode, which monitors the DFT signals from outside, will be described, using a drawing.

Figure 10:
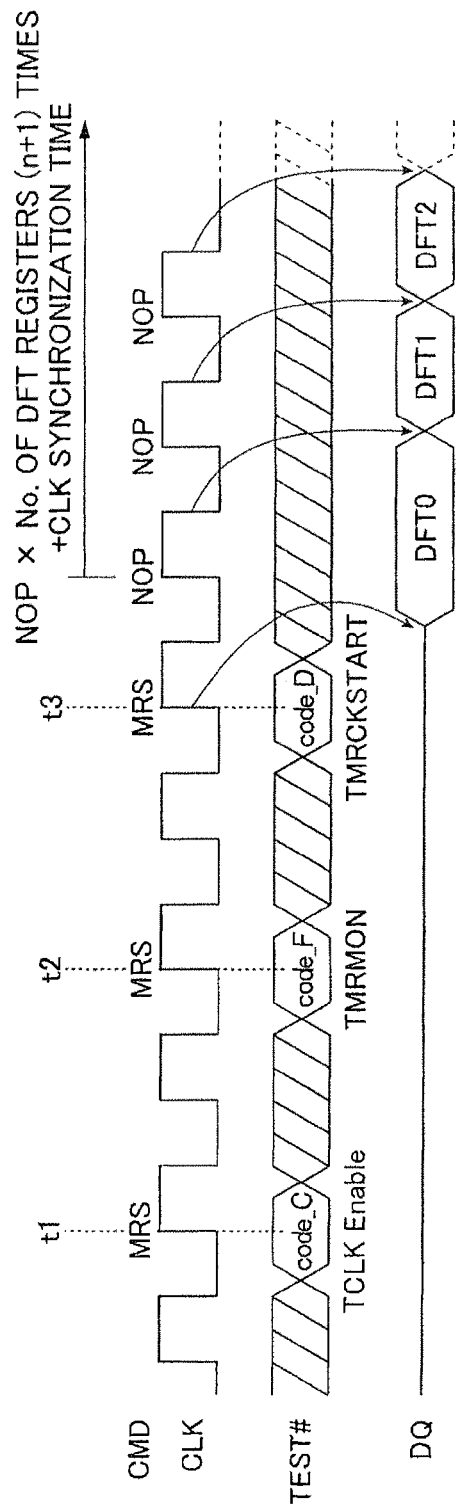
FIG. 10 is a timing chart of operations of semiconductor device of FIG. 2 in a DFT monitor mode to monitor a test control signal.

FIG. 10 is a timing diagram used for describing the DFT monitor mode that monitors the test control circuit of the test operation of the semiconductor device 100.

FIG. 10 shows the case in which the semiconductor device 100, in synchronization with an external clock input from outside, captures the test command signal (MRS) and test code signals (address code_C, code_F, code_D), and serially outputs to the external output terminal DQ the test control signal DFT(n−i) that is output to the control circuit CKT(n−i) by each of the DFT registers DFTri ($0 \le i \le n$) of the register unit 109.

Of the control signals used in the above-noted description of the circuit constitution, the DFT monitor signal TMRMON is generated by the decoder unit 106, using the test code signal test pre-address signal TPA.

At time t1, as described regarding the above-noted test mode entry, when the semiconductor device 100 captures the test command signal (MRS) and the test code signal (address code_C), in the decoder unit 106 a clock generating circuit generates a test clock TCLK0T in synchronization with the external clock CLK, and supplies this to the shift clock control circuit 111 (TCLK Enable).

At time t2, the command decoder 102 captures the test command (MRS) and outputs the test command signal TRS synchronized with the internal clock signal to the address latch 105. The address latch 105 latches the address signal (address code_F) input from outside in synchronization with the test command signal TRS, and supplies the test address signal TA to the decoder unit 106.

The decoder unit 106 supplies an active-level (high-level) DFT monitor signal DFTMON to the decoder unit 106.

At each of the plurality of DFT registers DFTri in the decoder unit 106, because the active-level DFT monitor signal TMRMON is input, the transfer gate TG4 turns on, and the test control signal DFT(n−i) that the DFT register itself outputs is captured at the internal node N304. When this occurs, because the shift clock TMRCK is at the inactive level (low level), each of the DFT registers DFTri outputs a signal having the same logic level as the test control signal DFT(n−i) as its own register output signal TSFTi. Therefore, after time t2, the final stage of DFT register outputs the register output signal TSFTn. When this occurs, because the buffer circuit DoutBuf connected to the output terminal of the final DFT register DFTrn of the register unit 109 (the terminal that outputs the register output signal TSFTn) is not activated, the buffer circuit DoutBuf does not output the register output signal TSFTn to the external output terminal DQ.

At time t3, as described regarding the above-noted test mode entry, when the semiconductor device 100 captures the test command signal (MRS) and the test code signal (address code_D), the register unit 106 supplies an active-level (high-level) shift start signal TMRCKSTART to the shift clock control circuit 111 and the 9-bit counter 112.

When the shift start signal TMRCKSTART input from the DFT decoder 202 changes to the active level (high level), the shift clock control circuit 111 makes the data shift state signal TMRSFTEN the active level (high level) and releases the reset state of the 9-bit counter 112. The shift clock control circuit 111 generates a shift clock TMRCK that has the same period (one cycle) as the test clock TCLK0T, and supplies this to the plurality of registers (DFT registers DFTr0 to DFTrn) and the 9-bit counter 112.

At time t3, when the data shift state signal TMRSFTEN changes to the high level, the decoder unit 106 actives the buffer circuit DoutBuf connected to the output terminal of the final DFT register DFTrn of the register unit 109 (the terminal that outputs the register output signal TSFTn).

By doing this, the buffer circuit Doutbuf outputs to the external output terminal DQ a test signal DFTIN0 supplied first to the selector 113 by the DFT decoder 202 (shown as DFT0 in FIG. 10).

At time t3, each of the plurality of DFT registers DFTri ($0 \le i \le n$) of the register unit 109 captures the register output signal TSFTi−1 of the previous DFT register in synchronization with the rising edge of the shift clock TMRCK and, in synchronization with the falling edge of the shift clock TMRCK, outputs the register output signal TSFTi captured to the next stage of DFT register.

This register output signal TSFTi is a signal having the same level as the test signal DFTINi supplied by the DFT decoder 202 to the plurality of DFT registers DFTri via the selector 113.

The shift clock TMRCK is supplied n times, and the final stage of DFT register DFTrn outputs to the buffer circuit DoutBuf as the register output signal TSFTn the test signal DFTIN(n−i) output to the control circuit CKT(n−i) by each of the DFT registers DFTri ($1 \le i \le n$) at the falling edge of each shift clock TMRCK.

The buffer circuit DoutBuf sequentially outputs the test signals DFTIN1 to DFTINn (shown as DFT1 and DFT2 in FIG. 10) to the external output terminal DQ.
(Shift Clock Selection Mode)

Next, the shift clock selection mode that frequency-divides and supplies the shift clock TMRCK to the register unit so that shift operation can be performed normally even in the case in which the clock CLK supplied from outside is a high-speed clock will be described.

Figure 11:
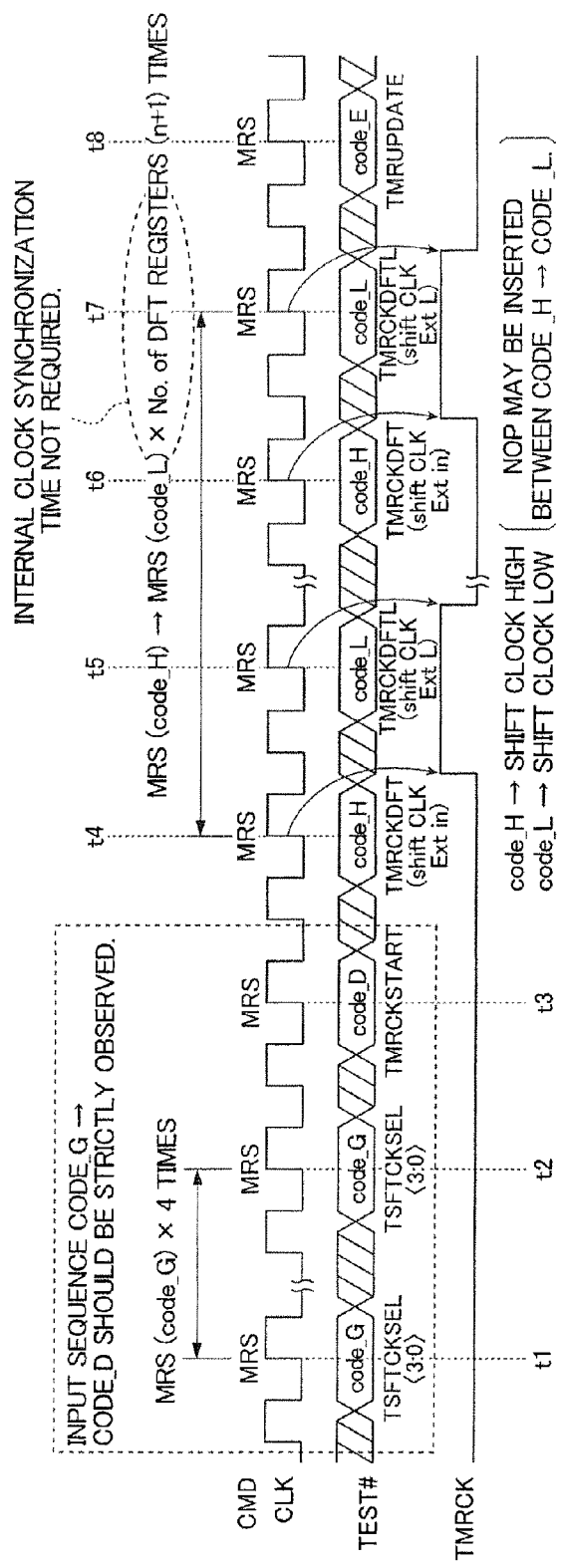
FIG. 11 is a timing chart of operations of semiconductor device of FIG. 2 in a shift clock selecting mode.

FIG. 11 is a timing diagram used to describe the shift clock selection mode part of the test operation of the semiconductor device 100.

FIG. 11 shows the case in which the semiconductor device 100, in synchronization with an external clock CLK input from outside, captures the test command signal (MRS) and test code signals (address code_G, code_D, code_H, code_L, code_E) and, by the shift clock input mode, arbitrarily sets the period of the shift clock TMRCK, and supplies the shift clock TMRCK to the register unit 109.

The logic levels of the shift clock selection signals TMRCKSEL[3:0], as described below, are established by the decoder unit 106, using the test code signal test pre-address signal TPA.

The timing of the rising edge and falling edge of the DFT input shift clock in the case of arbitrarily setting the period, as described below, is established by the decoder unit 106, using the test code signal test pre-address signal TPA.

First, the shift clock selection mode will be described.

When the semiconductor device 100 captures the test command signal (MRS) and the test code signal (address code_G), in synchronization with the external clock input from outside, the command decoder 102 outputs a test command signal TRS synchronized with the internal clock signal to the address latch 105. The address latch 105 latches the address signal (address code_F) input from outside in synchronization with the test command signal TRS, and supplies the test address signal TA to the decoder unit 106.

The decoder unit 106 sets the shift clock selection signal TMRCKSEL[0] of the shift clock selection signals TMRCK-SEL[3:0] to the active level (high level).

In this condition, when the semiconductor device 100 then captures the test command signal (MRS) and test code signal (address code_C), and the test command signal (MRS) and test code signal (address code_D), the shift clock selecting unit 111b selects a shift clock having two times the period (divide-by-2) of the test clock TCLK0T and generates the shift clock TMRCK. The shift operation of the register unit 109 is executed by the divide-by-2 shift clock TMRCK.

When the semiconductor device 100 captures the combination of the above-noted test command signal (MRS) and the test code signal (address code_G) two times consecutively, the decoder unit 106 is supplied with the test address signal TA two times, and makes the shift clock selection signal TMRCKSEL[1] of the shift clock selection signals TMRCK-SEL[3:0] the active level (high level). In this condition, when the semiconductor device 100 then captures the test command signal (MRS) and test code signal (address code_C), and the test command signal (MRS) and test code signal (address code_D), the shift clock selecting unit 111b selects a shift clock having four times the period (divide-by-4) of the test clock TCLK0T and generates the shift clock TMRCK. The shift operation of the register unit 109 is executed by the divide-by-4 shift clock TMRCK.

When the semiconductor device 100 captures the combination of the above-noted test command signal (MRS) and the test code signal (address code_G) three times consecutively, the decoder unit 106 is supplied with the test address signal TA three times, and makes the shift clock selection signal TMRCKSEL[2] of the shift clock selection signals TMRCK-SEL[3:0] the active level (high level). In this condition, when the semiconductor device 100 then captures the test command signal (MRS) and test code signal (address code_C), and the test command signal (MRS) and test code signal (address code_D), the shift clock selecting unit 111b selects a shift clock having eight times the period (divide-by-8) of the test clock TCLK0T and generates the shift clock TMRCK. The shift operation of the register unit 109 is executed by the divide-by-8 shift clock TMRCK.

As shown in FIG. 11, when the semiconductor device 100 captures the combination of the above-noted test command signal (MRS) and the test code signal (address code_G) four times consecutively, the decoder unit 106 is supplied with the test address signal TA four times, and makes the shift clock selection signal TMRCKSEL[3] of the shift clock selection signals TMRCKSEL[3:0] the active level (high level). In this condition, by the input of the DFT input shift clock to one input of the NAND circuit NAND555 shown in FIG. 5, it is possible make an arbitrary setting of the period of the shift clock TMRCK (shift clock input mode).

Therefore, in contrast to the change of the shift clock TMRCK period using the above-noted test clock TCLK0T, it is not necessary for the semiconductor device 100 to capture the test command signal (MRS) and test code signal (address code_C) after capturing the test command signal (MRS) and test code signal (address code_G) four times (TCLK Enable is unnecessary).

The shift clock input mode will be described, using FIG. 11.

Between time t1 and time t2, the semiconductor device 100 captures the above-noted combination of the test command signal (MRS) and test code signal (address code_G) four times consecutively. The decoder unit 106 makes the shift clock selection signal TMRCKSEL[3] the active level (high level) and, in the shift clock selecting unit 111b, the NAND circuit NAND555 to which the DFT input shift clock is input is selected.

Next, at time t3, as described regarding the above-noted test mode entry, when the semiconductor device 100 captures the test command signal (MRS) and the test code signal (address code_D), the decoder unit 106 supplies an active-level (high-level) shift start signal TMRCKSTART to the shift clock control circuit 111. The shift clock control circuit 111 makes the data shift state signal TMRSFTEN the active level (high level) and releases the reset state of the 9-bit counter 112.

In order to generate the shift clock TMRCK by the DFT input shift clock, operating margin is not necessary to stabilize the output of the frequency-dividing circuits within the shift clock control circuit 111, nor is an accompanying time period for synchronization with the test clock until the data shift state signal activation required. For this reason, the decoder unit 106 can just generate the DFT input shift clock the number of times (n+1) of the number of control circuits CKT, and supply these to the shift clock control circuit 111. The shift clock control circuit 111 generates a shift clock TMRCK a number of times (n+1) that is the number of control circuits CKT.

In the shift clock control circuit 111, because the shift clock selection signal TMRCKSEL[3] is at the active level (high level), the frequency-dividing circuits BC501 to BC503 are stopped, and the supply of the test clock TCLK0T by the decoder unit 106 is not necessary. For this reason, it is not necessary for the semiconductor device 100 to capture the test command signal (MRS) and the test code signal (address code_C) before capturing the test command signal (MRS) and the test code signal (address code_D), as in the operation of entry into the above-noted test mode and the DFT monitor mode.

At time t4, the command decoder 102 captures a test command (MRS) and outputs a test command signal TRS synchronized to the internal clock signal to the address latch 105. The address latch 105 latches an address signal (address code_H) input from outside in synchronization with the test command signal TRS and supplies the test address signal TA to the decoder unit 106. In the decoder unit 106, the DFT input shift clock is changed from the low level (inactive level) to the high level (active level). The shift clock control circuit 111 changes the shift clock TMRCK from the low level (inactive level) to the high level (active level). The DFT register DFTr0 (first register) in the register unit 109 captures data (the test signal DFTIN0 that is to be captured into the DFT register DFTrn) at the rising edge of the shift clock TMRCK.

At time t5, the command decoder 102 captures a test command (MRS) and outputs a test command signal TRS synchronized to the internal clock signal to the address latch 105. The address latch 105 latches an address signal (address code_L: the second test information) input from outside in synchronization with the test command signal TRS and supplies the test address signal TA to the decoder unit 106. In the decoder unit 106, the DFT input shift clock is changed from the high level (active level) to the low level (inactive level). The shift clock control circuit 111 changes the shift clock TMRCK from the high level (active level) to the low level (inactive level). The DFT register DFTr0 (first register) in the register unit 109 outputs data (the test signal DFTIN0 that is to be captured into the DFT register DFTrn) at the falling edge of the shift clock TMRCK to the next stage of DFT register DFTr1 as the register output signal TSFT0.

The test command (MRS) and the test code signal (TEST#) are signals, for example, that are supplied to the semiconductor device 100 by a semiconductor test apparatus (tester), which is capable of arbitrary settings of the test commands and test code signal input timing. Therefore, by making the input timing of the test command (MRS) and the test code signal (address code_H: first test information) that establish the high level of the DFT input shift clock, and of the test command (MRS) and the test code signal (address code_L: second test information) that establish the low level of the DFT input shift clock arbitrary, it is possible to arbitrarily set the period of the shift clock TMRCK.

Returning FIG. 11, between time t4 and time t7, the test command (MRS) and the test code signal (address code_H: first test information) that establish the high level of the DFT input shift clock, and the test command (MRS) and the test code signal (address code_L: second test information) that establish the low level of the DFT input shift clock are supplied to the semiconductor device 100 alternately (n+1) times in total. By doing this, the semiconductor device 100 executes a shift operation in the register unit 109 and transfers the (n+1) test signals DFTIN output by the decoder unit 106 to the corresponding DFT registers.

Then, at time t8, as described with regard to the test mode entry, the semiconductor device 100 captures the test command signal (MRS) and the test code signal (address code_E), the decoder unit 106 makes the DFT generation signal TMRUPDATE the active level, and the each of the DFT registers outputs the test control signal to the corresponding control circuit CKT.

In this manner, in the case in which the external clock CK supplied to the semiconductor device 100 is a high-frequency clock, by adopting a constitution that, by a shift clock selection mode, makes the shift clock TMRCK a low frequency, the need to provide a clock tree within the semiconductor device and the need to maintain synchronization between the shift clock TMRCK at each of the DFT registers is eliminated. By doing this, because it is possible to accommodate a high-frequency external clock CK and eliminate the circuitry scale required to configure a clock tree to maintain synchronization, it is possible to suppress an increase in the chip size of the semiconductor device.

(Transfer Data Direct Input Mode)

Next, a transfer data direct input mode, which is a mode in which high-level or low-level data input in a random sequence without using the output of the test signals DFTIN is transferred to each of the DFT registers from the DFT decoder 202, will be described.

Figure 12:
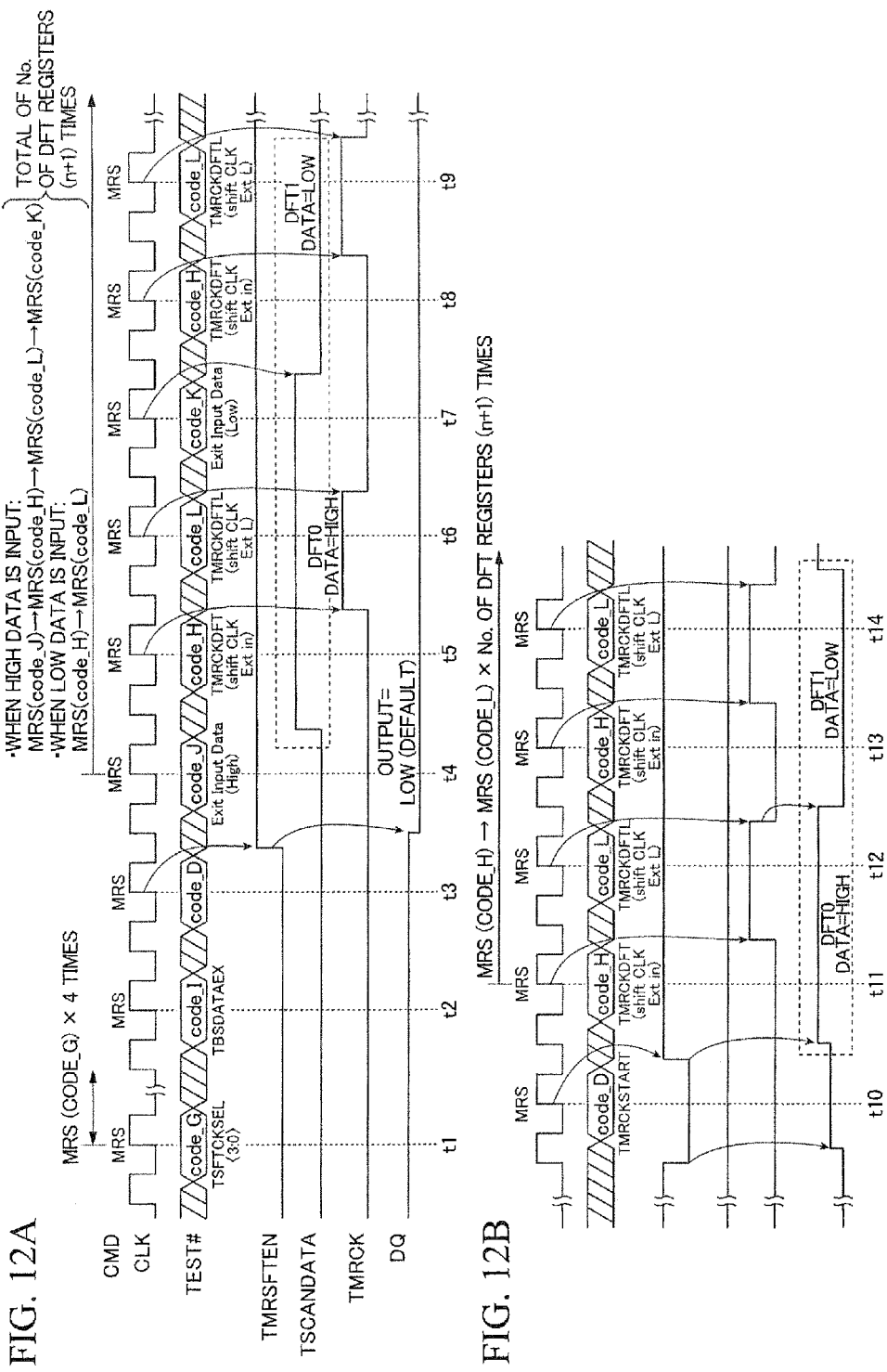
FIGS. 12A and 12B are timing charts of operations of semiconductor device of FIG. 2 in a transfer data direct input mode.

FIG. 12 is a timing diagram used for describing the transfer data direct input mode of the test operation of the semiconductor device 100.

FIG. 12A shows the case in which the semiconductor device 100 captures the test command signal (MRS) and test code signals (address code_G, code_I, code_D, code_J, code_H, code_L, and code_K) in synchronization with the external clock CLK input from the outside, and transfers the test signals DFTIN to the each of the DFT registers by the transfer data direct input mode. FIG. 12B shows the case in which, after transferring the test signals DFTIN to the DFT registers, the data shift operation is performed again, and the test signal DFTIN that is transferred from the DQ terminal to the respective DFT register is output. Also, the present mode uses the shift clock input mode, which is described above.

Between time t1 and time t2, as described with regard to the above-noted shift clock selection mode, the semiconductor device 100 captures the combination of the test command signal (MRS) and the test code signal (address code_G) four times consecutively, and transitions to the shift clock input mode that performs random setting of the shift clock TMRCK period.

At time t2, the command decoder 102 captures the test command (MRS), and output to the address latch 105 the test command signal TRS in synchronization with the internal clock signal. Also, the address latch 105 latches the address signal (address code_I: third test information) input from the outside in synchronization with the test command signal TRS, and supplies the test address signal TA to the decoder unit 106. The decoder unit 106 generates the test signals DFTIN at the high or the low level and, in place of the selector 113, supplies the high or low level to the register unit 109.

At time t3, as described regarding the above-noted shift clock selection mode, when the semiconductor device 100 captures the test command signal (MRS) and the test code signal (address code_D), the decoder unit 106 supplies to the shift clock control circuit 111a shift start signal TMRCK-START at the active level (high level). The shift clock control circuit 111 makes the data shift state signal TMRSFTEN the active level (high level), and releases the reset state of the 9-bit counter 112.

Also, at the time t3, the decoder unit 106 activates the buffer circuit DoutBuf, which is connected to the output terminal of the final-stage DFT register DFTrn of the register unit 109 (the terminal that outputs the register output signal TSFTn) to make the output terminal DQ low level (default).

Because the shift clock TMRCK is generated by the DFT input shift clock, so that operating margin is not necessary to stabilize the output of the frequency-dividing circuits within the shift clock control circuit 111, nor is an accompanying period of time for synchronization with the test clock up until the activation of the data shift state signal required, in the shift clock input mode, it is sufficient for the shift clock TMRCK just to generate a number of clocks that is the number of the control circuit CKT.

At time t4, the command decoder 102 captures the test command (MRS) and outputs to the address latch 105 the test command signal TRS in synchronization with the internal clock signal. The address latch 105 latches the address signal (address code_J: fourth test information) input from the outside, in synchronization with the test command signal TRS, and supplies the test address signal TA to the decoder unit 106. The decoder unit 106, in place of the selector 113, changes the shift data TSCANDATA from the low level to the high level.

At time t5, the command decoder 102 captures the test command (MRS) and outputs to the address latch 105 the test command signal TRS in synchronization with the internal clock signal. The address latch 105 latches the address signal (address code_H: first test information) input from the outside, in synchronization with the test command signal TRS, and supplies the test address signal TA to the decoder unit 106. The decoder unit 106 changes the DFT input shift clock from the low level (inactive level) to the high level (active level). The shift clock control circuit 111 changes the shift clock TMRCK from the low level (inactive level) to the high level (active level). The DFT register DFTr0 (the first register) of the register unit 109 captures the high-level data (the test signal DFTIN0 that should be captured at the DFT register DFTrn) at the shift clock TMRCK rising edge.

At time t6, the command decoder 102 captures the test command (MRS), and outputs to the address latch 105 the test command signal TRS in synchronization with the internal clock signal. The address latch 105 latches the address signal (address code_L: second test information) input from the outside, in synchronization with the test command signal TRS, and supplies the test address signal TA to the decoder unit 106. The decoder unit 106 changes the DFT input shift clock from the high level (active level) to the low level (inactive level). The shift clock control circuit 111 changes the shift clock TMRCK from the high level (active level) to the low level (inactive level). The DFT register DFTr0 (the first register) of the register unit 109 outputs the high-level data (the test signal DFTIN0 that should be captured at the DFT register DFTrn) at the shift clock TMRCK falling edge as the register output signal TSFT0 to the next-stage DFT register DFTr1.

At time t7, the command decoder 102 captures the test command (MRS), and outputs to the address latch 105 the test command signal TRS in synchronization with the internal clock signal. The address latch 105 latches the address signal (address code_K: fifth test information) input from the outside in synchronization with the test command signal TRS, and supplies the test address signal TA to the decoder unit 106. The decoder unit 106, in place of the selector 113, changes the test data TSCANDATA from the high level to the low level.

At time t8, the command decoder 102 captures the test command (MRS) in the same manner as at time t5, and outputs to the address latch 105 the test command signal TRS in synchronization with the internal clock signal. The address latch 105 latches the address signal (address code_H: first test information) input from the outside in synchronization with the test command signal TRS, and supplies the test address signal TA to the decoder unit 106. The decoder unit 106 changes the DFT input shift clock from the low level (inactive level) to the high level (active level). The shift clock control circuit 111 changes the shift clock TMRCK from the low level (inactive level) to the high level (active level). The DFT register DFTr0 (the first register) of the register unit 109 captures the low-level data (the test signal DFTIN1 that should be captured at the DFT register DFTr(n−1)) at the shift clock TMRCK rising edge. The DFT register DFTr1 (the register at the second stage) of the register unit 109 captures the high-level data (the test signal DFTIN0 that should be captured at the DFT register DFTrn) at the shift clock TMRCK rising edge.

At time t9, the command decoder 102 captures the test command (MRS) in the same manner as at time t6, and outputs to the address latch 105 the test command signal TRS in synchronization with the internal clock signal. The address latch 105 latches the address signal (address code_L: second test information) input from the outside in synchronization with the test command signal TRS, and supplies the test address signal TA to the decoder unit 106. The decoder unit 106 changes the DFT input shift clock from the high level (active level) to the low level (inactive level). The shift clock control circuit 111 changes the shift clock TMRCK from the high level (active level) to the low level (inactive level). The DFT register DFTr0 (the first register) of the register unit 109 outputs the low-level data (the test signal DFTIN1 that should be captured at the DFT register DFTr(n−1)) at the shift clock TMRCK falling edge as the register output signal TSFT0 to the next stage DFT register DFTr1 (the DFT register at the second stage). The DFT register DFTr1 of the register unit 109 outputs the high-level data (the test signal DFTIN0 that should be captured at the DFT register DFTrn) at the shift clock TMRCK falling edge as the register output signal TSFT1 to the next-stage DFT register DFTr2 (the DFT register at the third stage).

The test command (MRS) that changes the shift data TSCANDATA from the low level to the high level and the test code signal (address code_J: fourth test information), the test command (MRS) and the test code signal (address code_H: first test information) that establish the high level of the DFT input shift clock, and the test command signal (MRS) and the test code signal (address code_L: second test information) that establish the low level of the DFT input shift clock are made the first group (high data input).

The test command (MRS) and test code signal (address code_K: fifth test information) that change the shift data TSCANDATA from the high level to the low level, the test command (MRS) and test code signal (address code_H: first test information) that establish the high level of the DFT input shift clock, and the test command (MRS) and test code signal (address code_L: second test information) that establish the low level of the DFT input shift clock are made the second group (low data input).

During the time between the time t4 and the time t10, the commands and the test code signals of the first and second groups are input to the semiconductor device 100 (n+1) times in total, thereby causing generation of the shift clock TMRCK (n+1) times from shift clock control circuit 111. By doing this, the semiconductor device 100 performs shift operations at the register unit 109, transferring the (n+1) test signals DFTIN output by the decoder unit 106 to the corresponding the DFT registers.

In also the period of the transfer data direct input mode as shown in FIG. 12A (from the time t4 onward), because the data shift state signal TMRSFTEN is at the active level (high level), the 9-bit counter 112 executes a count-up operation in synchronization with the rising edge of the shift clock TMRCK. The shift clock control circuit 111 generates the shift clock TMRCK (n+1) times, thereby changing the shift data selection signal TCNT[8:0] output by the 9-bit counter 112 to (n+1), and the decoder unit 106 compares the shift data selection signals TCNT[8:0] with the final count value (n+1) and, because the two coincide, the final count signal is output to shift clock control circuit 111. The result is that, in shift clock control circuit 111, SRFF is reset, and the selector SEL 501 makes the data shift state signal TMRSFTEN the inactive level (low level).

The 9-bit counter 112 is reset, and the shift data selection signal TCNT[8:0] is made 0.

As shown in FIG. 12B, the data shift state signal TMRSFTEN changes to the low level, the buffer circuit DoutBuf that is connected to DFT of the final stage of the register unit 109 is inactivated, and the output terminal QD potential is made a high impedance (HiZ).

Because the shift start signal TMRCKSTART is at the inactivate level (low level), in order to output in serial each output of DFT registers of the register unit 109 from the external output terminal DQ sequentially using the shift clock input mode, it is necessary to change the shift start signal TMRCKSTART to the active level (high level) again.

At time t10, the command decoder 102 captures the test command (MRS), and outputs to the address latch 105 the test command signal TRS synchronized to the internal clock signal. The address latch 105 latches an address signal (address code_D) input from the outside in synchronization with the test command signal TRS, and supplies a test address signal TA to the decoder unit 106.

The decoder unit 106 supplies an active-level (high-level) shift start signal TMRCKSTART to the shift clock control circuit 111.

Subsequent operation performs operation combined with the above-described DFT monitor mode and the shift clock selection mode. As described above regarding the DFT monitor mode, when the data shift state signal TMRSFTEN changes to the high level, the decoder unit 106 activates the buffer circuit DoutBuf, which is connected to the output terminal of the final-stage DFT register DFTrn of the register unit 109 (the terminal that outputs the register output signal TSFTn).

The result is that is the buffer circuit DoutBuf outputs to the external output terminal DQ the test signal DFTIN0, which is first supplied to the register unit 109 by the decoder unit 106, rather than by the selector 113, (and which is in FIG. 10 represented as DFT0, captured by the DFT register DFTr, and is the same level as the signal output from the terminal that outputs the register output signal TSFTn).

At time t11, the command decoder 102 captures the test command (MRS) and outputs to the address latch 105 the test command signal TRS synchronized to the internal clock signal. The address latch 105 latches the address signal (address code_H: first test information) input from the outside, in synchronization with the test command signal TRS, and supplies the test address signal TA to the decoder unit 106. In the decoder unit 106, the DFT input shift clock is changed from the low level (inactive level) to the high level (active level). The shift clock control circuit 111 changes the shift clock TMRCK from the low level (inactive level) to the high level (active level). At the rising edge of the shift clock TMRCK the DFT register DFTrn of the final stage of the register unit 109 captures the register output signal of the DFT register DFTrn−1 in the previous stage (the low-level signal, which is the test signals DFTIN1 captured by the DFT register DFTrn−1). In the same manner, the DFT register DFTrn−1 captures the register output signal of the DFT register DFTrn−2 in the previous stage (the high level signal, which is the test signals DFTIN2 captured by the DFT register DFTrn−2).

At time t12, the command decoder 102 captures the test command (MRS) and outputs to the address latch 105 the test command signal TRS synchronized to the internal clock signal. The address latch 105 latches the address signal (address code_L: second test information) input from the outside, in synchronization with the test command signal TRS, and supplies the test address signal TA to the decoder unit 106. In the decoder unit 106, the DFT input shift clock is changed from the high level (active level) to the low level (inactive level). Shift clock control circuit 111 changes the shift clock TMRCK from the high level (active level) to the low level (inactive level). At the falling edge of the shift clock TMRCK, the DFT register DFTrn of the final stage of the register unit 109 outputs to the buffer circuit DoutBuf the test signal DFTIN1 captured at the rising edge of the previous shift clock TMRCK as the register output signal TSFTn. The buffer circuit DoutBuf, as shown in FIG. 12B, changes the output terminal DQ from the high level to the low level. In the same manner, the DFT register DFTrn−1 outputs to the DFT register DFTrn the test signals DFTIN2 captured at the rising edge of the previous shift clock TMRCK as the register output signal TSFTn−1.

At time t13, in the same manner as at time t11, the command decoder 102 captures the test command (MRS) and outputs to the address latch 105 the test command signal TRS synchronized to the internal clock signal. The address latch 105 latches the address signal (address code_H: first test information) input from the outside, in synchronization with the test command signal TRS, and supplies the test address signal TA to the decoder unit 106. In the decoder unit 106, the DFT input shift clock is changed from the low level (inactive level) to the high level (active level). The shift clock control circuit 111 changes the shift clock TMRCK from the low level (inactive level) to the high level (active level). At the rising edge of the shift clock TMRCK, the DFT register DFTrn of the final stage of the register unit 109 captures the register output signal of the DFT register DFTrn−1 in the previous stage (the high level signal, which is the test signal DFTIN2 captured by the DFT register DFTrn−2).

At time t14, in the same manner as the time t12, the command decoder 102 captures the test command (MRS) and outputs to the address latch 105 the test command signal TRS synchronized to the internal clock signal. The address latch 105 latches the address signal (address code_L: second test information) input from the outside, in synchronization with the test command signal TRS, and supplies the test address signal TA to the decoder unit 106. In the decoder unit 106, the DFT input shift clock is changed from the high level (active level) to the low level (inactive level). Shift clock control circuit 111 changes the shift clock TMRCK from the high level (active level) to the low level (inactive level). At the falling edge of the shift clock TMRCK, the DFT register DFTrn of the final stage of the register unit 109 outputs to the buffer circuit DoutBuf the test signal DFTIN2 captured at the rising edge of the previous shift clock TMRCK as the register output signal TSFTn. The buffer circuit DoutBuf, as shown in FIG. 12B, changes the output terminal DQ from the low level to the high level.

After the time t14, as described regarding the above-noted shift clock selection mode, the test command (MRS) and the test code signal (address code_H: the first test information) that establish the high level of the DFT input shift clock, and the test command (MRS) and the test code signal (address code_L: the second test information) that establish the low level are alternatively input to the semiconductor device 100, the shift clock control circuit 111 thereby generating the shift clock TMRCK. The register unit 109 performs a shift operation. By doing this, the buffer circuit DoutBuf sequentially outputs to the external output terminal DQ the test signals DFTIN3 to DFTINn, which are supplied to the register unit 109 by the decoder unit 106 rather than by the selector 113 (which are the same level as the signals that, in the shift operation as shown in FIG. 12A, are captured at each of the DFT registers DFTrn−3 to DFTr0 and output from the terminals that output each of the register output signals TSFT).

In this manner, in the operation as shown in FIG. 12B, the test command (MRS) and the test code signal (address code_H: first test information) that establish the high level of the DFT input shift clock, and the test command (MRS) and the test code signal (address code_L: second test information) that establish the low level are alternately input to the semiconductor device 100. The semiconductor device 100 executes a shift operation in the register unit 109, and sequentially outputs from the output terminal DQ the (n+1) test signals DFTIN, which the decoder unit 106, rather than the selector 113, has supplied to each of the DFT registers of the register unit 109.

The output from the output terminal DQ (data input from the output terminal DQ to the tester) and the data previously input to the register unit 109 by the decoder unit 106, rather than the selector 113, (data input from the tester using a command and a test code signal) are compared, thereby verifying whether or not the shift operation in the register unit 109 is operating normally. That is, in the test operation, it is possible to detect whether or not a test signal is correctly transferred to the register unit 109.

Also, without outputting from the output terminal DQ shown in FIG. 12B, after inputting data (test signal DFTIN) to the register unit 109 beforehand (at the time t10 as shown in FIG. 12), if the above-described DFT generation signal TMRUPDATE is input to the register unit 109 using the test command and test code signal, it is possible to output the test code signal from the DFT register so as to activate the control circuit CKT (to set a test operation mode).

The technical concept of the present application can be applied to a test signal transferring circuit of a semiconductor device with many test items.

Also, the circuit types in each of the circuit blocks disclosed by drawings, and the circuits that generate other control signal are not limited to the circuit types disclosed by the embodiments.

The technical concept of the semiconductor device of the present invention can be applied to various semiconductor devices.

For example, the present invention is generally applicable to semiconductor devices such as a CPU (central processing unit), a MCU (micro-controller unit), a DSP (digital signal processor), an ASIC (application-specific integrated circuit), an ASSP (application-specific standard product), and a memory. Examples of the forms of semiconductor device products to which the present invention can be applied include an SOC (system-on-chip), an MCP (multi-chip package), a POP (package-on-package). The present invention is applicable to a semiconductor device having these arbitrary product forms or package types.

The transistor may preferably be a field-effect transistor (FET), and application can be made in addition to a MOS (metal oxide semiconductor) transistor, various FETs such as MIS (metal-insulator-semiconductor), a TFT (thin-film transistor) and the like. Some bipolar type transistors can be provided in the device.

A NMOS transistor (n-channel MOS transistor) is a typical example of a transistor of a first conductivity type, and a PMOS transistor (p-channel MOS transistor) is a typical example of a transistor of a second conductivity type.

The term "configured" is used to describe a component, section or part of a device includes hardware and/or software that is constructed and/or programmed to carry out the desired function.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A device comprising:
   a decoder configured to generate a plurality of test signals;
   a selector coupled to the decoder, the selector being configured to sequentially select a test signal from the plurality of test signals and to sequentially output the test signal selected; and
   a plurality of registers coupled in series to each other, the plurality of registers including a first stage register, the first stage register being coupled to the selector to sequentially receive the test signal from the selector.

2. The device according to claim 1, further comprising:
   a shift clock generating circuit coupled to each of the plurality of registers, the shift clock generating circuit being configured to generate a shift clock from an external clock and to supply the shift clock to each of the plurality of registers;
   wherein each of the plurality of registers is configured to perform a series transfer of an associated one of the plurality of test signals, in response to the shift clock from the shift clock generating circuit.

3. The device according to claim 2, further comprising:
   a plurality of control circuits coupled to the plurality of registers, respectively,
   wherein each of the plurality of registers is configured to activate an associated one of the plurality of control circuits, in response to the shift clock from the shift clock generating circuit.

4. The device according to claim 2, further comprising:
   a counter coupled to the selector and the shift clock generating circuit, the counter being configured to define the number of selecting by the selector.

5. The device according to claim 4, wherein the counter is configured to generate a shift data selecting signal by counting the shift clock, and to supply the shift data selecting signal to the selector, and the selector is configured to sequentially select one of the plurality of test signals in accordance with the shift data selecting signal.

6. A device comprising:
   a decoder configured to decode a test information and generate a plurality of signals;
   a plurality of registers coupled in series to each other, the plurality of registers including a first register on a first stage of the plurality of registers;
   a plurality of control circuits coupled to the plurality of registers, respectively;
   a selector coupled to the decoder and to the first stage register, the selector being configured to select a signal from the plurality of signals and supply the signal as a shift data to the first register;
   a counter configured to define the number of selecting by the selector, the counter being configured to supply the selector with a shift data selection signal which sequentially changes the signal to be selected by the selector from the plurality of signals; and
   a shift clock generating circuit configured to generate a shift clock having a same number of clock cycles as the number of the plurality of control circuits, the shift clock generating circuit being configured to supply the shift clock to the counter and the plurality of registers.

7. The device according to claim 6, wherein the decoder is configured to generate a shift start signal with reference to the test information, the decoder is configured to supply the shift start signal to the shift clock generating circuit, the shift clock generating circuit comprises: a data shift state control unit and a shift clock selecting unit, the data shift state control unit is configured to generate a data shift state signal in response to the shift start signal, and to supply the data shift state signal to the shift clock selecting unit, and the shift clock selecting unit comprises a plurality of frequency divider circuits coupled in series to each other, the plurality of frequency divider circuits are configured to divide an external clock in accordance with the data shift state signal, the plurality of frequency divider circuits are configured to select as the shift clock the external clock or one of outputs from the plurality of frequency divider circuits, the plurality of frequency divider circuits are configured to supply the shift clocks, which correspond to the number of the clock cycle, to the counter and the plurality of registers.

8. The device according to claim 7, wherein the data shift state control unit is configured to terminate supplying the data shift state signal to the shift clock selecting unit when the number of selecting by the selector reaches a given number.

9. The device according to claim 7, wherein the counter is configured to count up the shift data selection signal in response to the data shift state signal and in synchronous with the shift clock, the selector comprises a count decoder configured to decode the shift data selection signal, the selector is configured to output the plurality of signals, in synchronous with the shift clock and in accordance with a result of decoding by the count decoder, and the selector supplies the plurality of signals as the shift data to the first register.

10. The device according to claim 9, wherein the shift data selection signal comprises a plurality of groups, each of the plurality of groups including a plurality of selection signals which are different from other selection signals of other groups, the count decoder includes a plurality of sub-decoders having a plurality of input nodes, the plurality of input nodes being configured to receive the plurality of input nodes, the selector comprises a plurality of switches and a latch circuit, the plurality of switches are coupled in series to each other, the plurality of switches includes a final stage switch, the latch circuit being configured to receive an output from the final stage switch, each of the plurality of sub-decoders is configured to generate an output which controls conductive and non-conductive states of an associated one of the plurality of switches, the plurality of switches is configured to be selectively switched in accordance with the shift data selection signal to select a signal of the plurality of signals and supply the signal as data to the latch circuit, and the latch circuit is configured to output the data as the shift data in synchronous with the shift clock.

11. The device according to claim 7, wherein the first register is configured to fetch the shift data from the selector in synchronous with the shift clock, each of other registers than the first register is configured to fetch data signals from a previous stage register of the other registers than the first register in synchronous with the shift clock, and each of other registers than the final register is configured to supply the data signals to a next stage register of the other registers than the final register in synchronous with the shift clock.

12. The device according to claim 11, wherein the decoder is configured to generate a test signal generation signal in accordance with the test information and to supply the test signal generation signal to each of the plurality of registers, each of the plurality of registers is configured to supply data as test control signals to an associated one of the plurality of control circuits, in response to the test signal generation signal, so that the associated one of the plurality of control circuits operates in a test operation mode that is different from a normal operation mode.

13. The device according to claim 12, wherein the decoder is configured to generate a test signal monitoring signal in accordance with the test information and supply the test signal monitoring signal to each of the plurality of registers, each of the plurality of registers comprises an input register and an output register, the input register is configured to latch the test control signal output from the output register.

14. The device according to claim 11, further comprising: a data output terminal;

wherein the final register is configured to supply data to the data output terminal.

15. The device according to claim 7, wherein the decoder is configured to generate a shift clock selecting signal in accordance with the test information and supply the shift clock selecting signal to the shift clock selecting unit, and the shift clock selecting unit is configured to select as the shift clock the external clock or one of outputs from the plurality of frequency divider circuits, in accordance with the shift clock selecting signal.

16. The device according to claim 15, wherein the shift clock selecting unit is configured to be synchronized with one of the shift clock and the external clock, the one of the shift clock and the external clock being selected in accordance with the shift clock selecting signal.

17. The device according to claim 16, wherein the decoder is configured to a test signal input shift clock in accordance with first and second test informations associated with the test information, and to supply the test signal input shift clock to the shift clock selecting signal, the first test information defines a rising edge of the shift clock, the second test information defines a falling edge of the shift clock, the test signal input shift clock is risen when the test information is the first test information when the external clock is risen, and the test signal input shift clock is fallen when the test information is the second test information when the external clock is risen, the shift clock selecting unit is configured to output the test signal shift clock as the shift clock.

18. The device according to claim 17, wherein the decoder is configured to be supplied with a command and a third test information which is associated with the command, the command is to command direct input of the shift data into each of the plurality of registers, the selector is configured to output high or low logic in accordance with fourth and fifth test informations, the fourth test information defines high logic of the output from the selector, the fifth test information defines low logic of the output from the selector, the fourth and fifth test informations are to be supplied subsequent to the third test information, the decoder is configured to generate the test signal shift clock in accordance with the first and second test informations and supply the test signal shift clock to the shift clock selecting unit in a period of time to maintain the output from the sector to be high or low, the shift clock selecting unit is configured to output the test signal input shift clock as the shift clock.

19. The device according to claim 16, wherein the shift clock selecting unit is configured to terminate frequency dividing operation by the plurality of frequency divider circuits in accordance with the shift clock selecting signal.

20. The device according to claim 6, further comprising:

a memory cell array including a plurality of memory cells; and a peripheral circuit configured to control the plurality of memory cells, wherein the plurality of control circuits are distributed over at least one of the memory cell array and the peripheral circuit, and each of the plurality of registers is disposed adjacent to an associated one of the plurality of control circuits.

* * * * *